(12) United States Patent
Waldis et al.

(10) Patent No.: US 9,804,501 B2
(45) Date of Patent: Oct. 31, 2017

(54) OPTICAL COMPONENT

(71) Applicant: Carl Zeiss SMT GmbH, Oberkochen (DE)

(72) Inventors: Severin Waldis, Bern (CH); Marco Jassmann, Neresheim-Dorfmerkingen (DE); Caglar Ataman, Neuchatel (CH); Roger Marc Bostock, Muensingen (CH); Jian Deng, Biel (CH); Sebastian Lani, Courtman (CH); Benedikt Knauf, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 439 days.

(21) Appl. No.: 14/334,107

(22) Filed: Jul. 17, 2014

(65) Prior Publication Data

US 2014/0327895 A1    Nov. 6, 2014

Related U.S. Application Data

(63) Continuation of application No. PCT/EP2013/052925, filed on Feb. 14, 2013.

(Continued)

(30) Foreign Application Priority Data

Feb. 17, 2012    (DE) .................. 10 2012 202 502

(51) Int. Cl.
G03B 27/54    (2006.01)
G03B 27/72    (2006.01)
(Continued)

(52) U.S. Cl.
CPC ......... G03F 7/702 (2013.01); G02B 26/0816 (2013.01); G02B 26/0833 (2013.01);
(Continued)

(58) Field of Classification Search
CPC ........... G02B 26/0816; G02B 26/0833; G02B 26/0841; G02B 26/0858; G02B 19/0023;
(Continued)

(56) References Cited

U.S. PATENT DOCUMENTS 5,110,195 A    5/1992 Loney
6,384,952 B1 *    5/2002 Clark ................ G02B 26/06
                                                    359/200.6

(Continued)

FOREIGN PATENT DOCUMENTS

CN    101986207 A    3/2011
CN    102193331 A    9/2011
(Continued)

OTHER PUBLICATIONS

International Search Report for corresponding PCT/EP2013/052925, dated Aug. 16, 2013.
(Continued)

*Primary Examiner* — Christina Riddle
(74) *Attorney, Agent, or Firm* — Fish & Richardson P.C.

(57) ABSTRACT

An optical component comprising a mirror array having a multiplicity of mirror elements, which each have at least one degree of freedom of displacement, and which are each connected to at least one actuator for displacement, has a multiplicity of local regulating devices for damping oscillations of the mirror elements, wherein each of the regulating devices in each case has at least one capacitive sensor having at least one moveable electrode and at least one electrode arranged rigidly relative to the carrying structure.

20 Claims, 34 Drawing Sheets

Related U.S. Application Data

Figure 1:
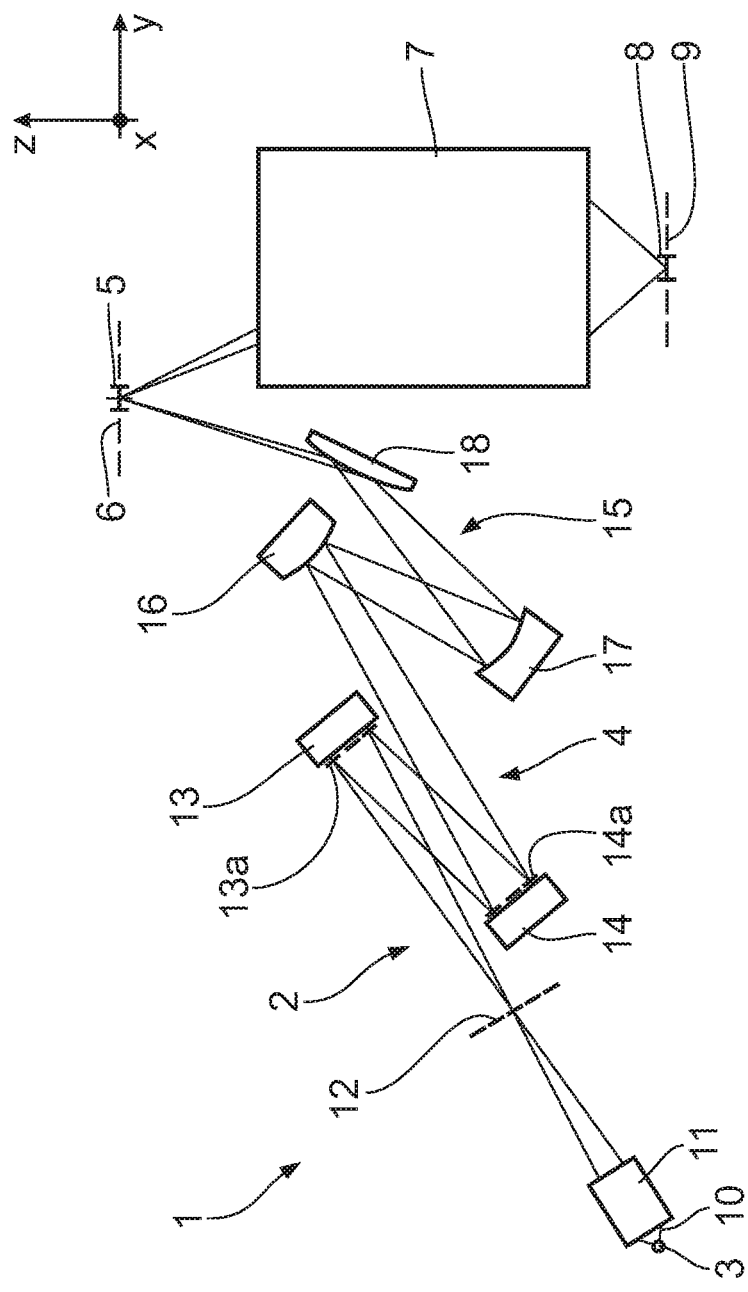

(60) Provisional application No. 61/600,046, filed on Feb. 17, 2012.

(51) Int. Cl.
*G03F 7/20* (2006.01)
*G02B 26/08* (2006.01)

(52) U.S. Cl.
CPC ........ *G03F 7/70075* (2013.01); *G03F 7/7085* (2013.01); *G03F 7/70116* (2013.01); *G03F 7/70291* (2013.01)

(58) Field of Classification Search
CPC ............. G02B 19/0047; G03F 7/70075; G03F 7/70116; G03F 7/702; G03F 7/70291; G03F 7/7085; G03F 7/7015; G03F 7/70191; G03F 7/70266; G03F 7/70308; G03B 7/1827
USPC ............... 355/30, 46, 52, 53, 55, 66–71, 77; 250/492.1, 492.2, 492.22, 492.23, 493.1, 250/548; 359/316, 201.2, 201.1, 850, 855
See application file for complete search history.

(56) References Cited

U.S. PATENT DOCUMENTS

| | | | |
|---|---|---|---|
| 7,145,269 B2 | 12/2006 | Hol | |
| 2003/0025982 A1 | 2/2003 | Wang et al. | |
| 2003/0174374 A1 | 9/2003 | Takeuchi | |
| 2003/0174376 A1 | 9/2003 | Sane et al. | |
| 2005/0047711 A1 | 3/2005 | Ide et al. | |
| 2005/0111119 A1 | 5/2005 | Oldham et al. | |
| 2006/0033389 A1* | 2/2006 | Esashi | G02B 26/0841 310/75 R |
| 2007/0273853 A1* | 11/2007 | Bleeker | G03B 27/54 355/46 |
| 2008/0013680 A1 | 1/2008 | Singer et al. | |
| 2009/0002668 A1 | 1/2009 | Rohe et al. | |
| 2009/0097094 A1 | 4/2009 | Tanaka | |
| 2009/0128886 A1 | 5/2009 | Hirota | |
| 2009/0229547 A1 | 9/2009 | Braune et al. | |
| 2010/0295639 A1* | 11/2010 | Kawabata | B81B 3/0037 335/106 |
| 2011/0027542 A1 | 2/2011 | Nagai et al. | |
| 2011/0188017 A1 | 8/2011 | Horn et al. | |
| 2011/0222033 A1 | 9/2011 | Ten Kate et al. | |
| 2012/0044474 A1 | 2/2012 | Hauf et al. | |
| 2012/0287414 A1 | 11/2012 | Fiolka et al. | |
| 2012/0293784 A1 | 11/2012 | Xalter | |
| 2014/0327896 A1 | 11/2014 | Waldis et al. | |

FOREIGN PATENT DOCUMENTS

| | | |
|---|---|---|
| CN | 102257421 A | 11/2011 |
| DE | 10 2010 001 388 A1 | 8/2011 |
| EP | 1 225 481 A | 7/2002 |
| EP | 2 009 501 A2 | 12/2008 |
| JP | 2005-099682 | 4/2005 |
| JP | 2009-075557 | 4/2009 |
| JP | 2009-111369 | 5/2009 |
| JP | 2010-518595 | 5/2010 |
| JP | 2011-180528 | 9/2011 |
| JP | 2015-515116 | 5/2015 |
| WO | WO 2007/134574 A | 11/2007 |
| WO | WO 2008/095695 | 8/2008 |
| WO | WO 2008/131930 A1 | 11/2008 |
| WO | WO 2010/049076 A2 | 5/2010 |
| WO | WO 2010/094658 A1 | 8/2010 |
| WO | WO 2011/091900 A2 | 8/2011 |
| WO | WO 2013/120926 | 8/2013 |

OTHER PUBLICATIONS

"Technology for Assemblies in Electronic Mounting" ("Baugruppentechnologie der Elektronik-Montage"), editor: Wolfgang Scheel, 2nd edition, Verlag Technik, Berlin, 1999, translation of pp. 13 and 45-51.

German Examination Report, with translation thereof, for DE Appl No. 10 2012 202 502.2, dated Dec. 21, 2012.

Japanese Office Action with English translation thereof for corresponding JP Appl. No. 2014-557031, dated Nov. 1, 2016, 13 pages.

* cited by examiner

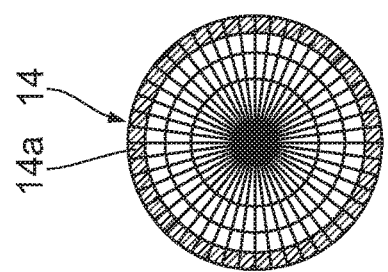
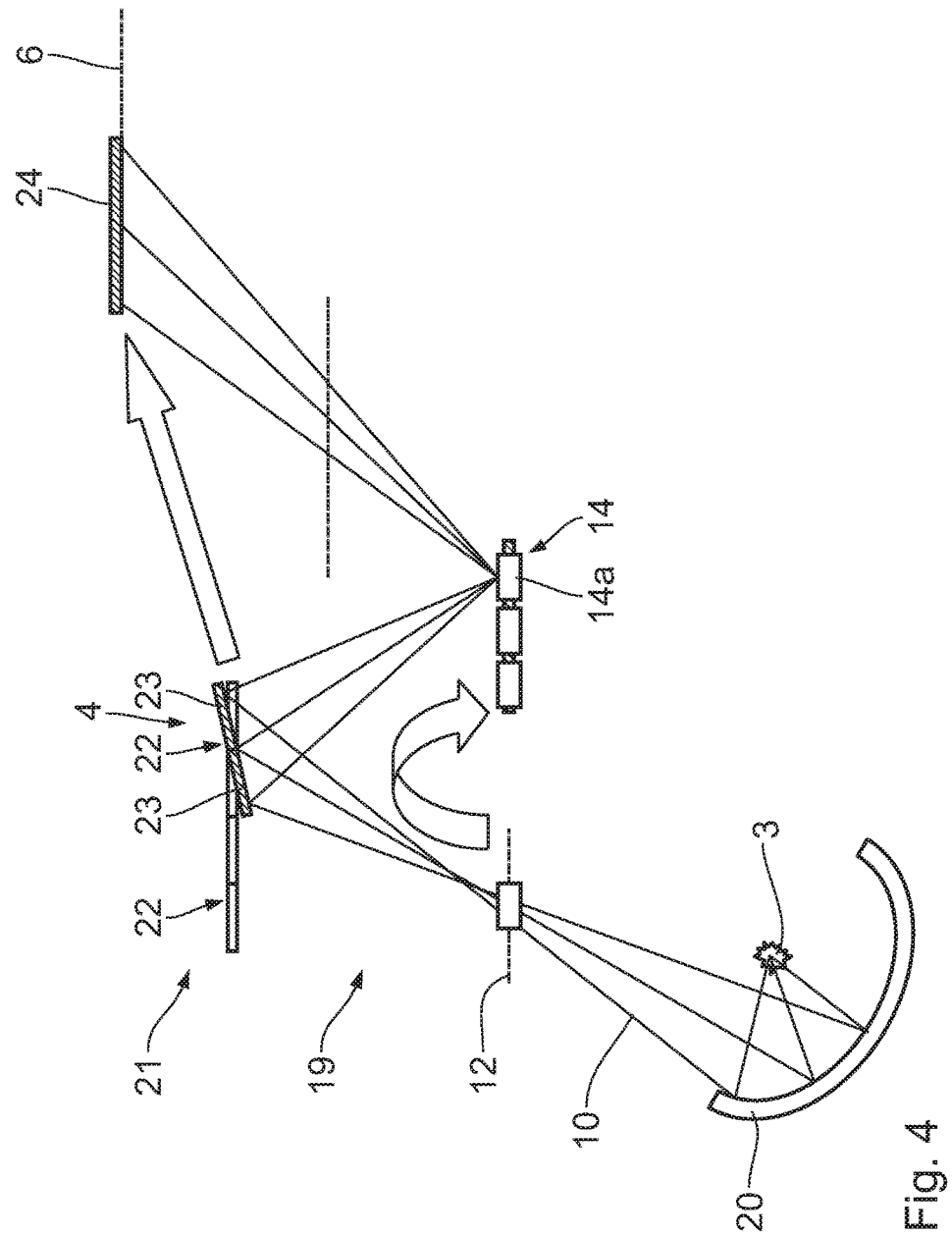

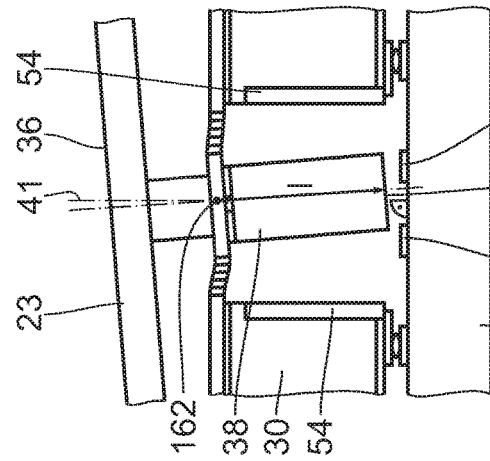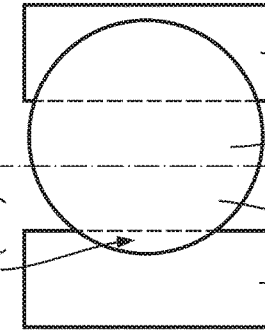
Fig. 45a  Fig. 45b
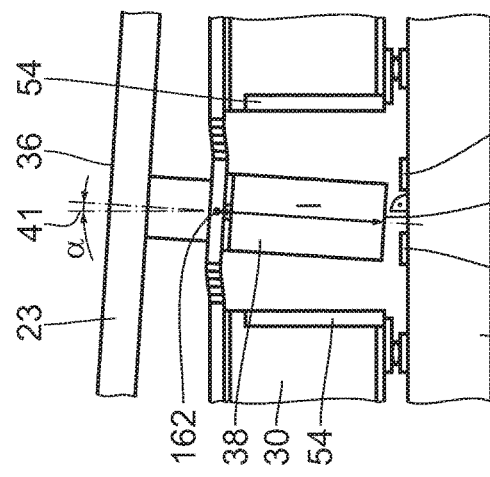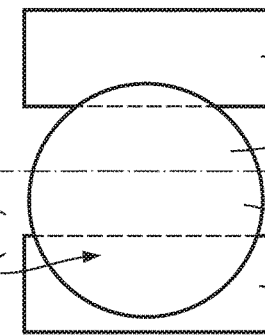
Fig. 44a  Fig. 44b
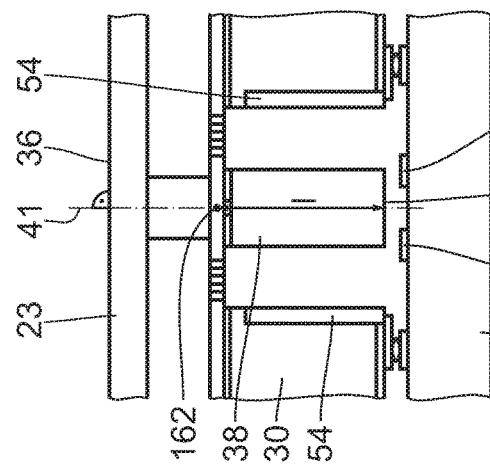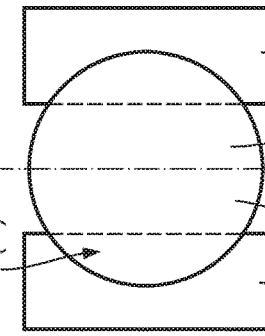
Fig. 43a  Fig. 43b

OPTICAL COMPONENT

CROSS-REFERENCE TO RELATED APPLICATIONS

The present application is a continuation of, and claims benefit under 35 USC 120 to, international application PCT/EP2013/052925, filed Feb. 14, 2013, which claims benefit under 35 USC 119 of German Application No. 10 2012 202 502.2, filed Feb. 17, 2012. International application PCT/EP2013/052925 also claims priority under 35 USC 119(e) to U.S. Provisional Application No. 61/600,046, filed Feb. 17, 2012. The entire contents of international application PCT/EP2013/052925 and German Application No. 10 2012 202 502.2 are incorporated by reference herein.

The invention relates to an optical component and a method for the production thereof. The invention furthermore relates to a mirror system and a method for positioning a multiplicity of mirror elements of a mirror system. Moreover, the invention relates to an optical assembly, an optical unit for a projection exposure apparatus, an illumination system for an EUV projection exposure apparatus and a projection exposure apparatus for EUV microlithography. Finally, the invention relates to a method for producing a micro- or nanostructured component, and a component produced according to this method.

Mirror arrays having a multiplicity of individual mirrors are known from the prior art. WO 2010/049076 A2 describes, for example, a mirror array of this type. The exact positioning of the individual mirrors of a mirror array of this type is very complex.

One object of the present invention is to improve an optical component having a mirror array having a multiplicity of individual mirrors.

This object is achieved an optical component which includes a mirror array having a multiplicity of mirror elements which each have at least one degree of freedom of displacement and which are each connected to at least one actuator for displacement. The optical component also includes a carrying structure which is mechanically connected to the mirror array, and a multiplicity of local regulating devices for damping oscillations of the mirror elements. The totality of the mirror elements forms a parqueting of a total reflection surface of the mirror array. The mirror array has a total surface extending perpendicular to a surface normal. The carrying structure projects beyond the total surface of the mirror array in a direction perpendicular to the surface normal by at most 5 mm. Each of the regulating devices in each case has at least one capacitive sensor having at least one moveable electrode and at least one electrode arranged rigidly relative to the carrying structure. The heart of the invention consists in providing, in a mirror array having a multiplicity of individual mirrors for damping oscillations of the individual mirrors local control loops each having at least one capacitive sensor. A capacitive sensor can be produced in a simple manner and can be adapted very flexibly to the respective requirements. Moreover no additional structures are required in addition to the structures present anyway in the carrying structure of the mirror array.

The regulating devices serve, in particular, for damping oscillations of the individual mirrors, which can never be completely avoided in particular on account of ever present base point excitations. It has been found that the oscillation amplitudes that occur are considerably above the accuracy value required for an illumination optical unit for a projection exposure apparatus. Such oscillations can be effectively damped with the aid of the regulating devices according to the invention. The oscillation amplitude can be reduced in particular at least by a factor of ten, in particular at least by a factor of thirty, preferably at least by a factor of fifty, via the regulating devices according to the invention.

The capacitive sensor is embodied as a speed sensor, in particular.

The sensor of the regulating devices in each case comprises at least one moveable electrode and at least one rigid electrode. In this case, the moveable electrode is mechanically connected to the associated mirror element and is thus moved upon a displacement, in particular pivoting, thereof relative to the rigid electrode. According to the invention, it has been recognized that this relative movement of the moveable and rigid electrodes can be measured as a change in the capacitance between the two electrodes.

According to a further aspect, the invention relates to an optical component comprising a. a mirror array having a multiplicity of mirror elements,
 i. which each have at least one degree of freedom of displacement, and
 ii. which are each connected to at least one actuator for displacement,
b. a carrying structure, which is mechanically connected to the mirror array, and
c. a multiplicity of local regulating devices for damping oscillations of the mirror elements,
d. wherein each of the regulating devices in each case has at least one capacitive sensor having at least one moveable electrode and at least one electrode arranged rigidly relative to the carrying structure.

According to some embodiments, the sensor has, for each degree of freedom of displacement of the associated mirror element, in each case at least one electrode which is rigid relative to the carrying structure. The sensor has, in particular for each degree of freedom of tilting of the associated mirror element, in each case at least one electrode which is rigid relative to the carrying structure. In this case, the rigid electrodes can be embodied in such a way that they are assigned to exactly one of the degrees of freedom of displacement, in particular one of the tilting directions defined by the actuators, and are insensitive to displacements of the associated mirror element with respect to a degree of freedom of displacement that differs therefrom or a different tilting direction. This also leads to a significant simplification of the feedback and regulating electronics. It is advantageous, in particular, to arrange the electrodes of the sensor in a manner corresponding to actuator electrodes. Preferably, each actuator electrode is respectively assigned one or two sensor electrodes which are preferably insensitive to a displacement of the mirror element via a different actuator electrode. In this case, there is no so-called cross-coupling between the displacement directions defined by the actuator and the sensor electrodes. In this regard, it should be noted that these degrees of freedom of displacement are not necessarily linearly independent.

Preferably, the sensor comprises for each degree of freedom of displacement of the associated mirror element, in each case at least two rigid electrodes. The latter are preferably differentially interconnected. It is thereby possible to reduce the influence of interference signals and thus to improve the signal-to-noise ratio. The influence of parasitic capacitances can also be reduced thereby.

It has furthermore been recognized that a predefined characteristic for the sensor can be achieved via a targeted embodiment of the rigid electrode, in particular via the shaping thereof. According to some embodiments, the form of the rigid electrode is embodied, in particular, in such a way that the sensor has a linear characteristic. It can also be advantageous to adapt the sensor characteristic to a position-dependent sensitivity of the actuator for displacing the mirror elements via targeted shaping of the rigid electrode. The feedback electronics can thereby be simplified.

According to some embodiments, the rigid electrodes are preferably in each case integrated into an application-specific integrated circuit (ASIC). This enables the rigid electrodes to be produced particularly simply and very flexibly.

According to some embodiments, the movable electrode of the sensor can in each case form a constituent part of the actuator for actuating the associated mirror element. The actuator and the sensor thus form an actuating-sensing unit. This simplifies the construction of the component. In particular, the number of constituent parts required is reduced.

According to some embodiments, the moveable electrode is in each case electrically decoupled, in particular insulated, from the associated mirror element. This reduces the coupling-in of interference signals. In particular, this prevents possible charge fluctuations in the mirror element which can be brought about by electro-optical effects for example, from influencing the capacitance measurement.

Preferably each of the mirror elements is assigned in each case exactly one of the regulating devices, wherein the regulating device is in each case arranged completely within a volume defined by parallel projection of the associated mirror element. Since, in other words, the regulating devices do not project laterally beyond the mirror surface of the associated mirror element, it is possible, in principle, for the mirror array to be embodied with as many mirror elements as desired. Moreover, a plurality of mirror arrays of this type can be juxtaposed virtually without any gaps.

According to some embodiments, the local regulating devices each have at least one electronic circuit. The latter is embodied, in particular, as an ASIC. It is preferably arranged in the carrying structure or integrated into the latter.

A further object of the invention is to improve a method for producing a component described above. This object is achieved via a method for producing a component as described herein, in which a lithographic step is provided for fashioning the rigid electrodes. The heart of the invention consists in using a lithographic step for producing the rigid electrodes, in particular for fashioning the latter. The rigid electrodes are fashioned, in particular via a lithographic step during ASIC production. This can also be performed during the post-processing thereof. Consequently, no additional method steps are required for producing the local sensor. The latter is therefore also integrated into the component in terms of method engineering.

A further object of the invention is to improve a mirror system. This object is achieved via a mirror system that includes at least one component as described herein and a global control/regulating device for displacing the mirror elements. The advantages correspond to those which have been described with regard to the component.

The global control/regulating device can be embodied as a position regulator, in particular having a bandwidth of less than 10 Hz, or as a pure actuating element. Via the global control/regulating device, the positions of a multiplicity of mirror elements, in particular of all mirror elements of a mirror array of one or more components, can be predefined.

A further object of the invention consists in improving a method for positioning a multiplicity of mirror elements of a mirror system. This object is achieved via a method for positioning a multiplicity of mirror elements of a mirror system. The method includes a mirror system as described herein, predefining position data for positioning each of the mirror elements via the global control/regulating device, and damping disturbances of the positioning of the mirror elements via the local regulating devices. The heart of the invention consists in damping disturbances of the positioning of the individual mirrors of a mirror array via local control loops. The control loops serve, in particular for damping oscillations of the individual mirrors with frequencies in the range of the natural frequencies of the individual mirrors or a multiple thereof. They serve, in particular for damping oscillations having frequencies of more than 100 Hz, in particular more than 500 Hz, in particular more than 1 kHz. The control loops have a correspondingly large bandwidth for this purpose. A fine positioning of the individual mirrors can also be performed via the local control loops.

Further objects of the invention are to an optical assembly, an optical unit for a projection exposure apparatus, an improve illumination system for an EUV projection exposure apparatus, and a projection exposure apparatus for EUV microlithography. These objects are achieved via the features of the optical assemblies, optical units, illumination systems and projection exposure apparatuses described herein. The advantages correspond to those described above.

Further objects of the invention consist in improving a method for producing a micro- or nanostructured component and a component produced in this way. These objects are achieved via a method for producing a micro- or nanostructured component, wherein the method includes providing a substrate, to which a layer composed of a light-sensitive material is at least partly applied, providing a reticle having structures to be imaged, providing a projection exposure apparatus describe herein, and projecting at least one part of the reticle onto a region of the light-sensitive layer of the substrate with the aid of the projection exposure apparatus, and also via a component made by such a process. For the advantages reference should be made once again to the preceding statements.

Figure 3:
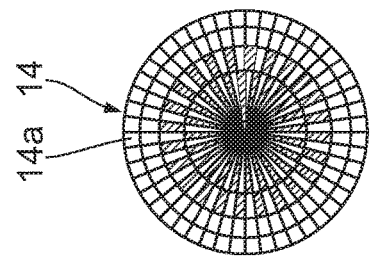
Figure 2:
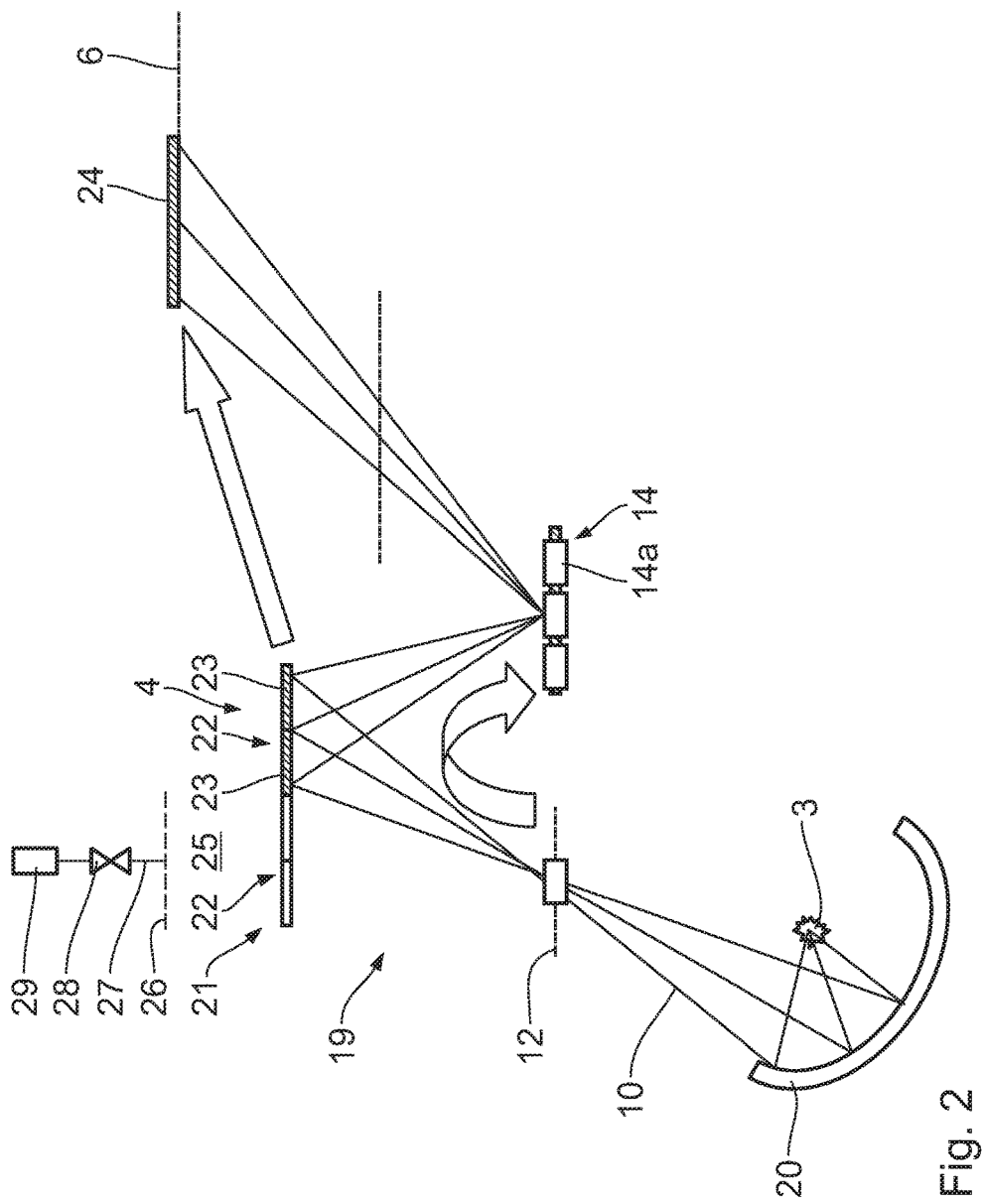
Figure 6:
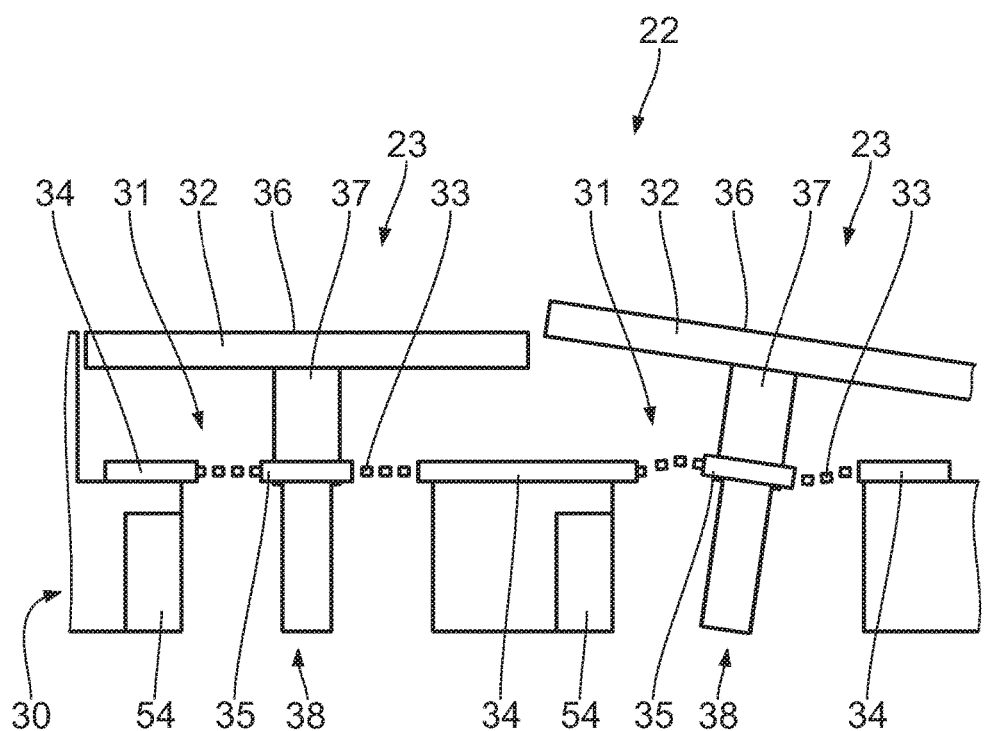
Figure 7:
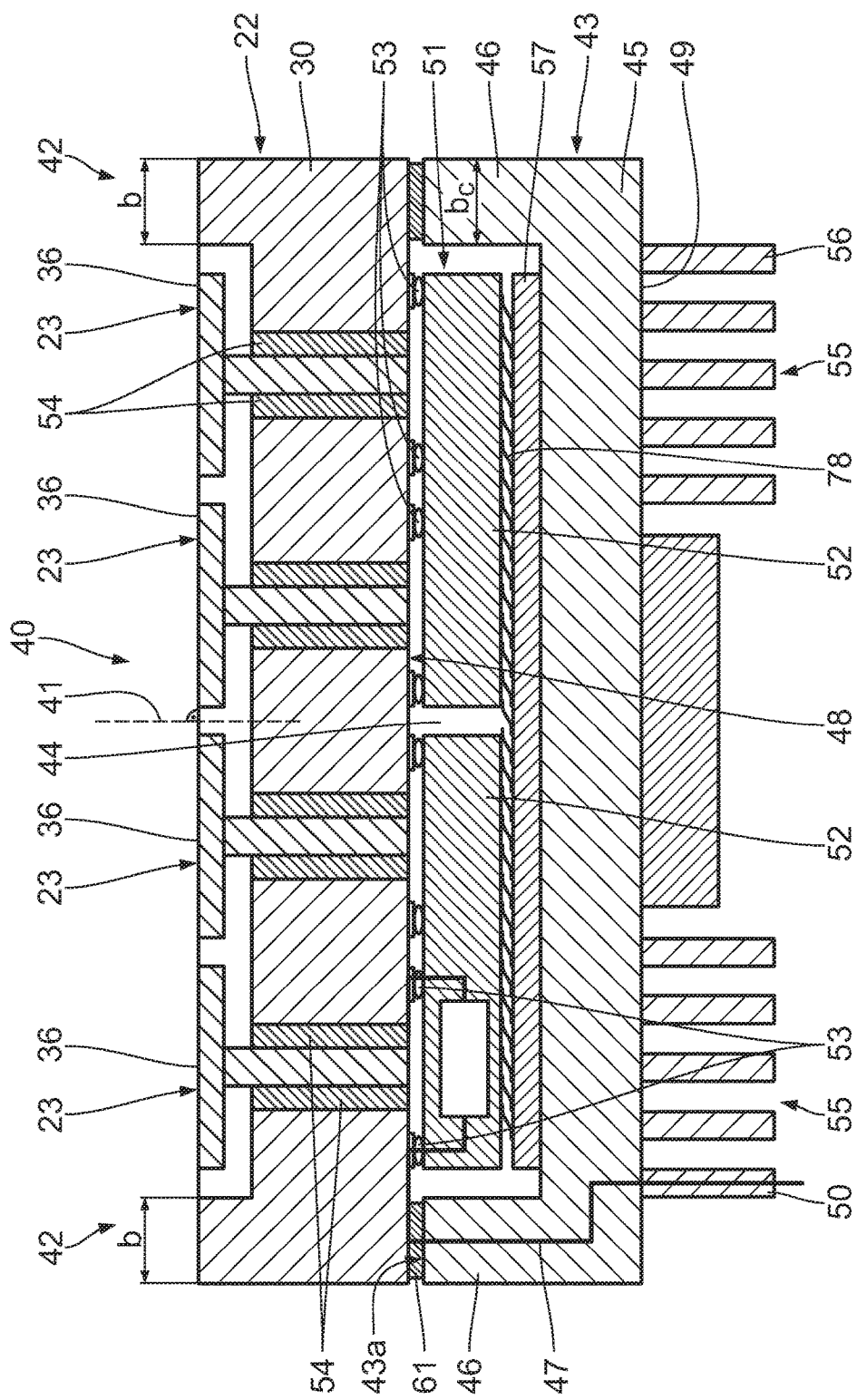
Figure 8:
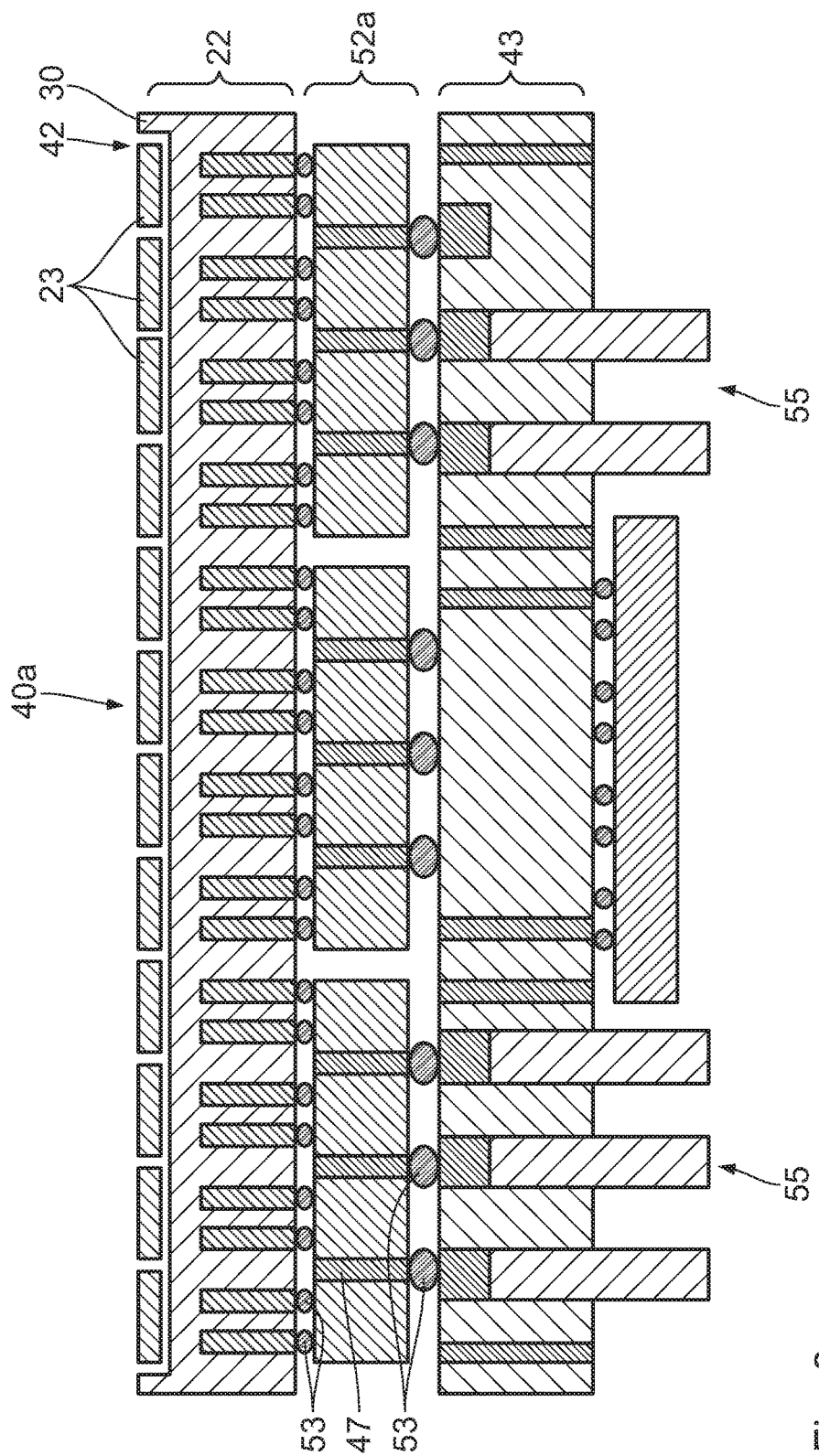
Figure 9:
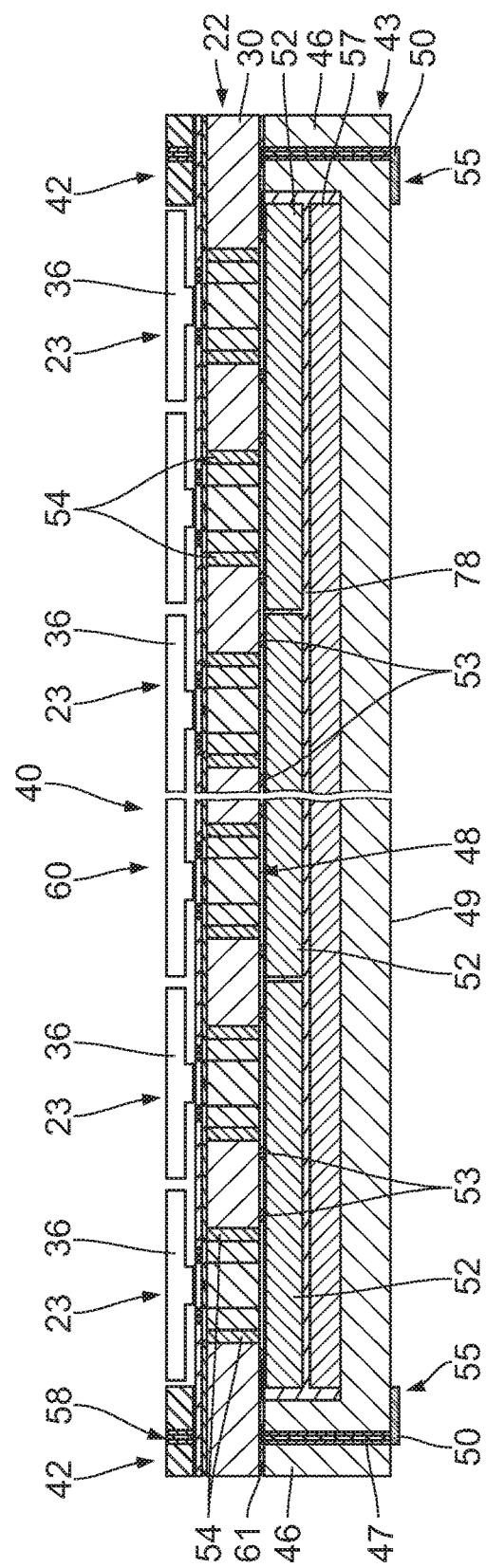
Figure 10:
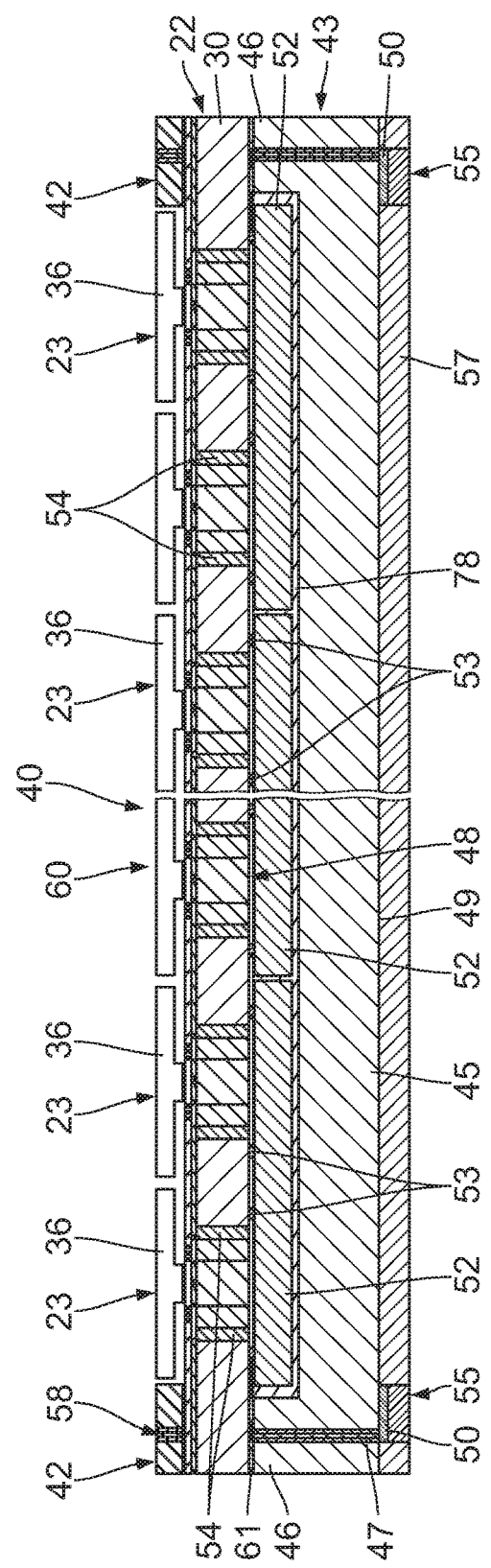
Figure 11:
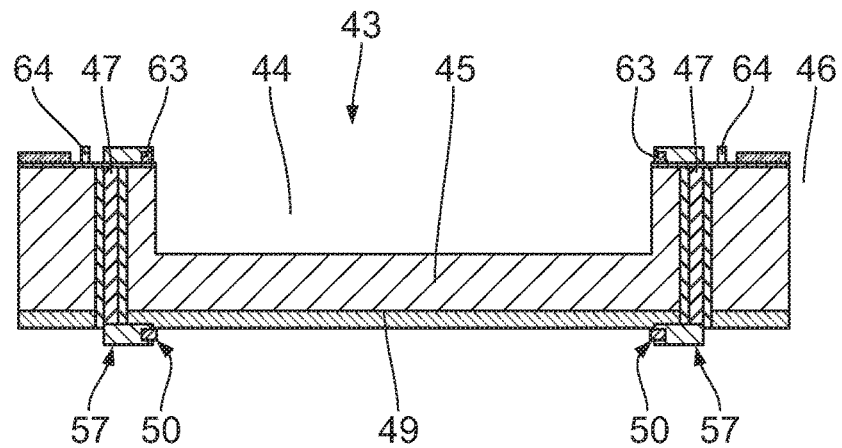
Figure 12:
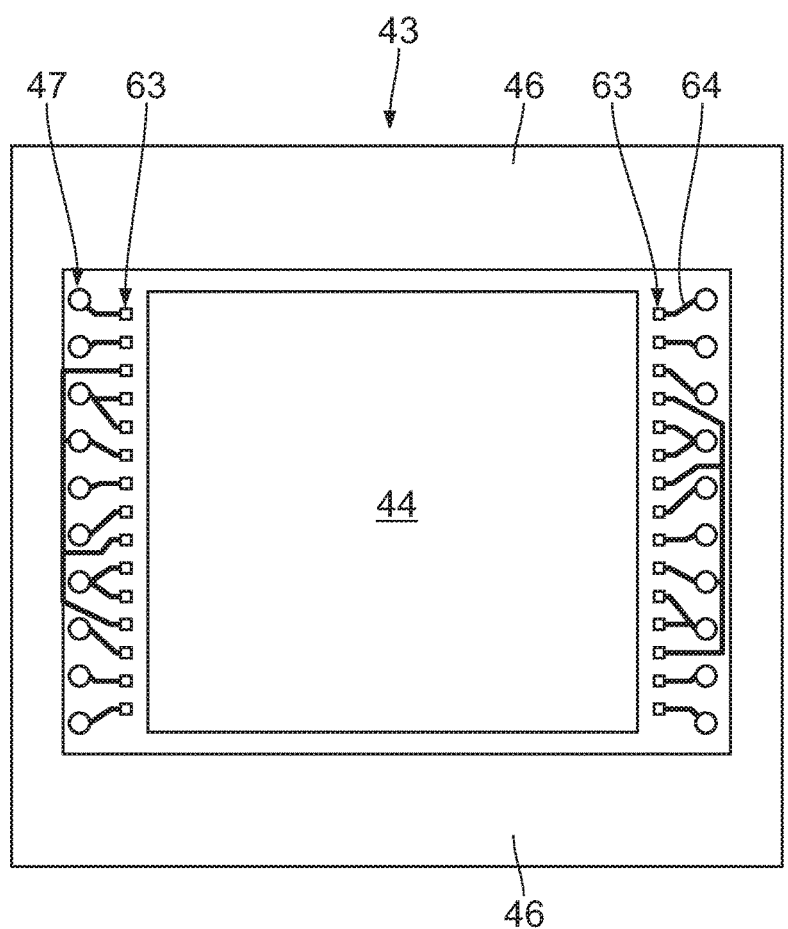
Figure 13:
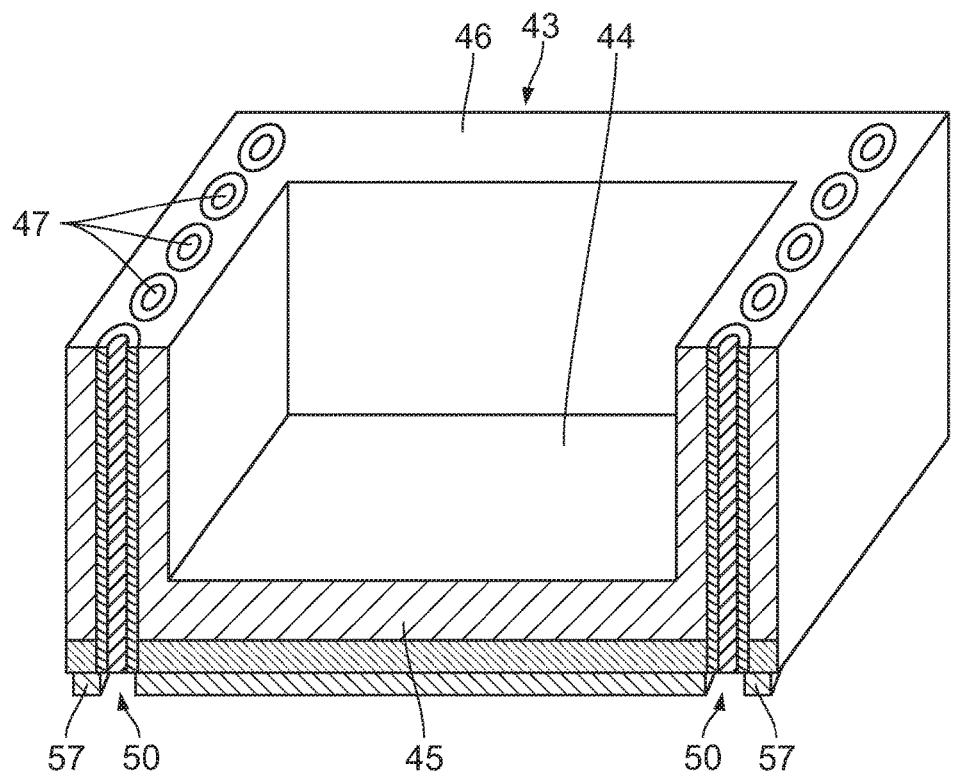
Figure 14:
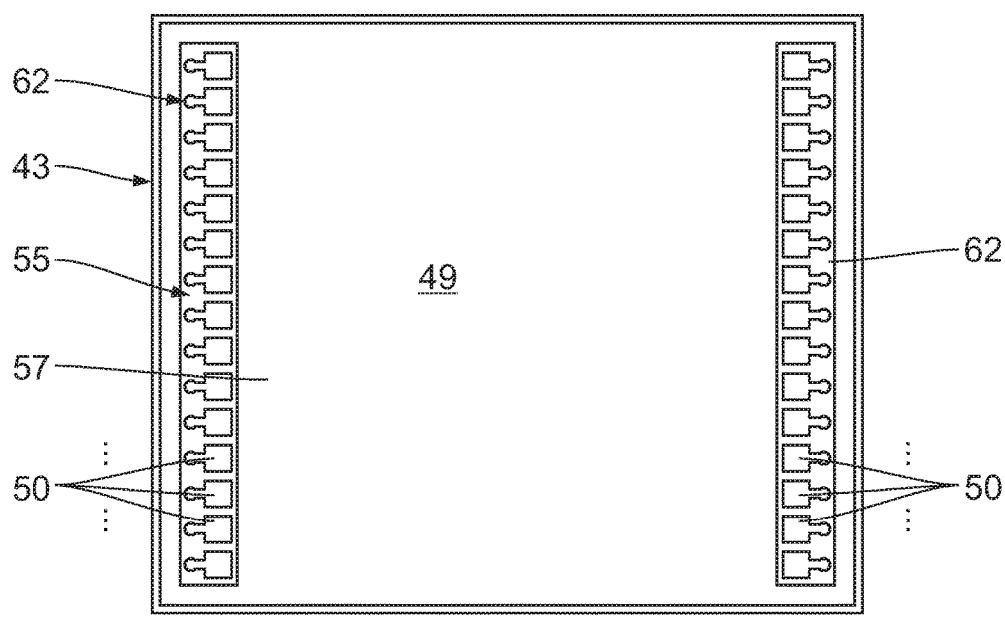
Figure 15:
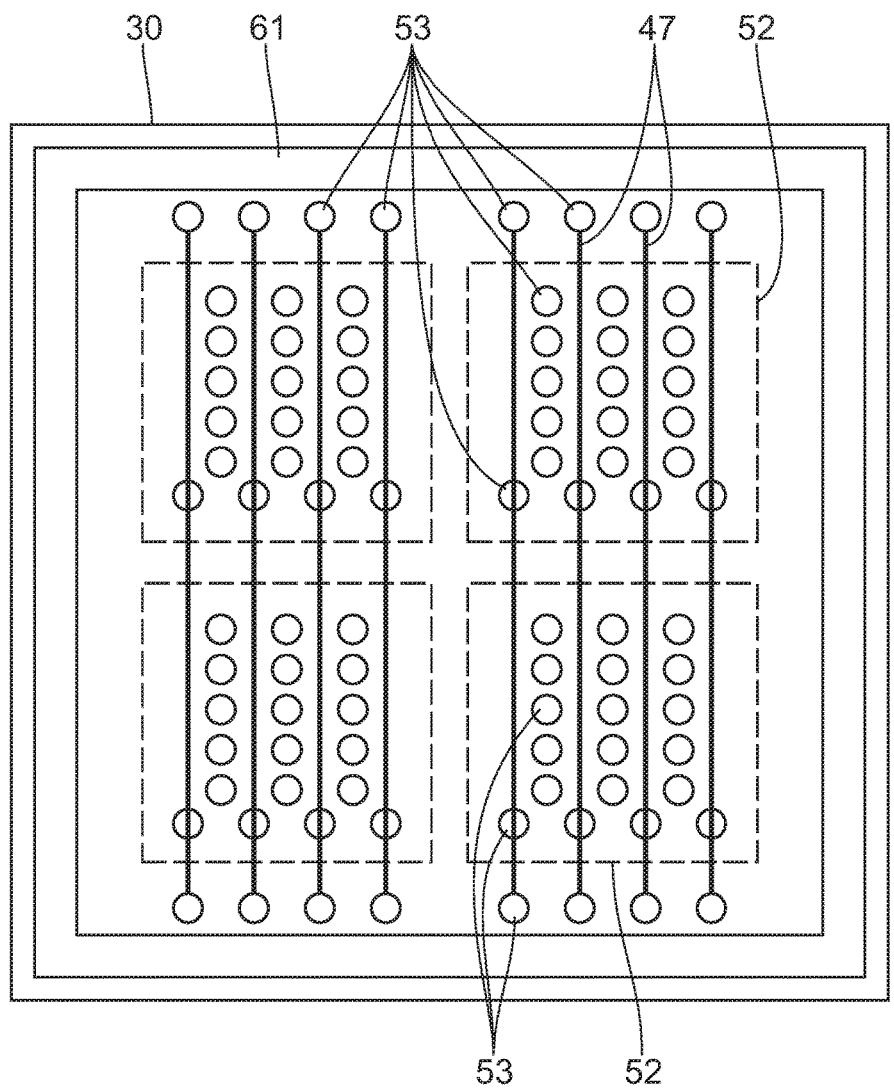
Figure 16:
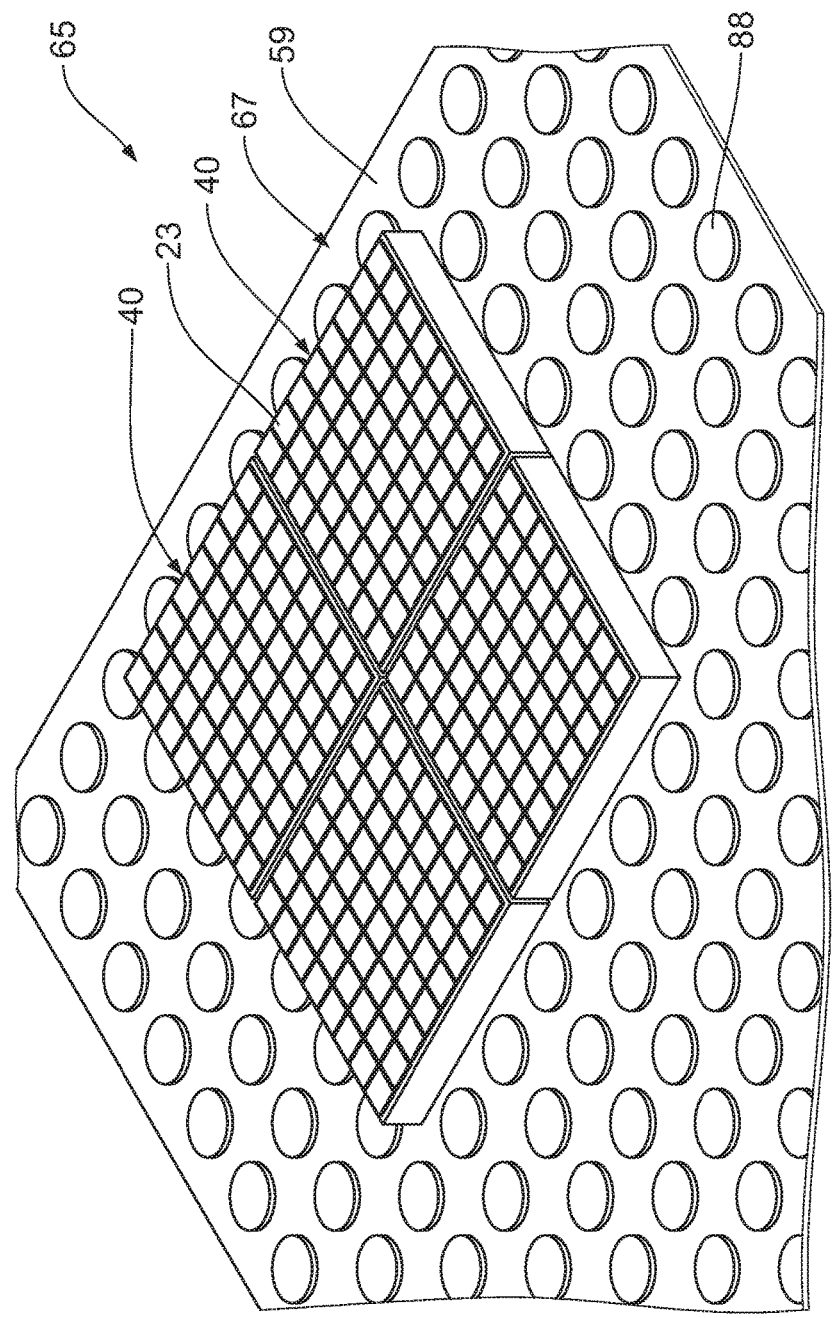
Figure 17:
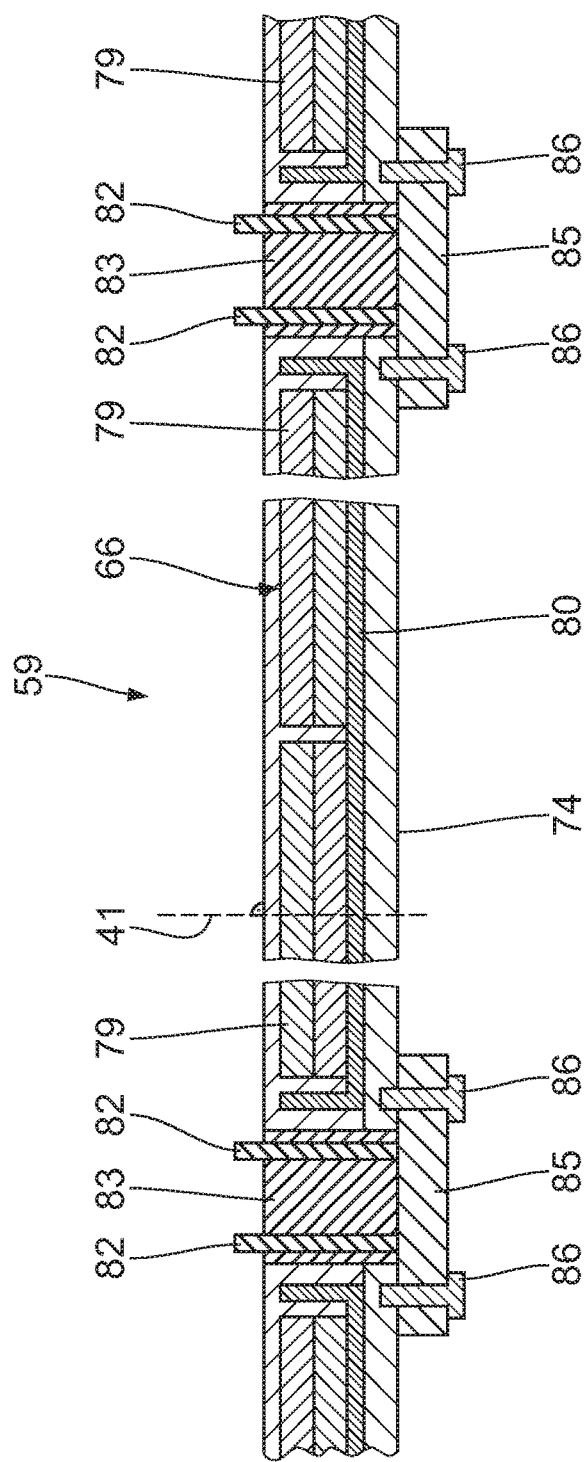
Figure 19:
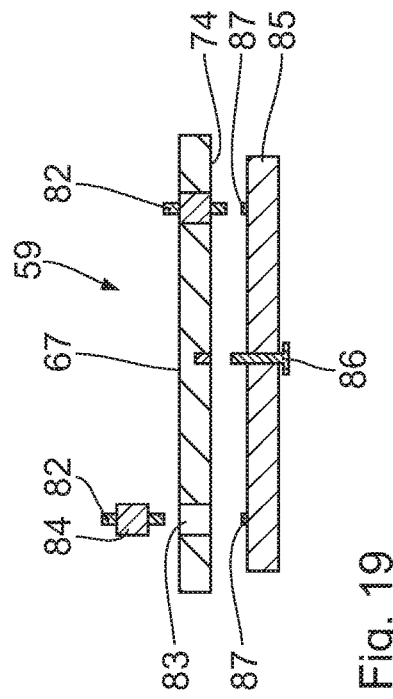
Figure 20:
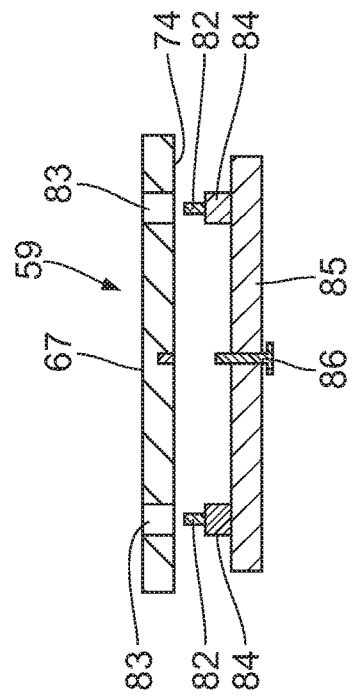
Figure 18:
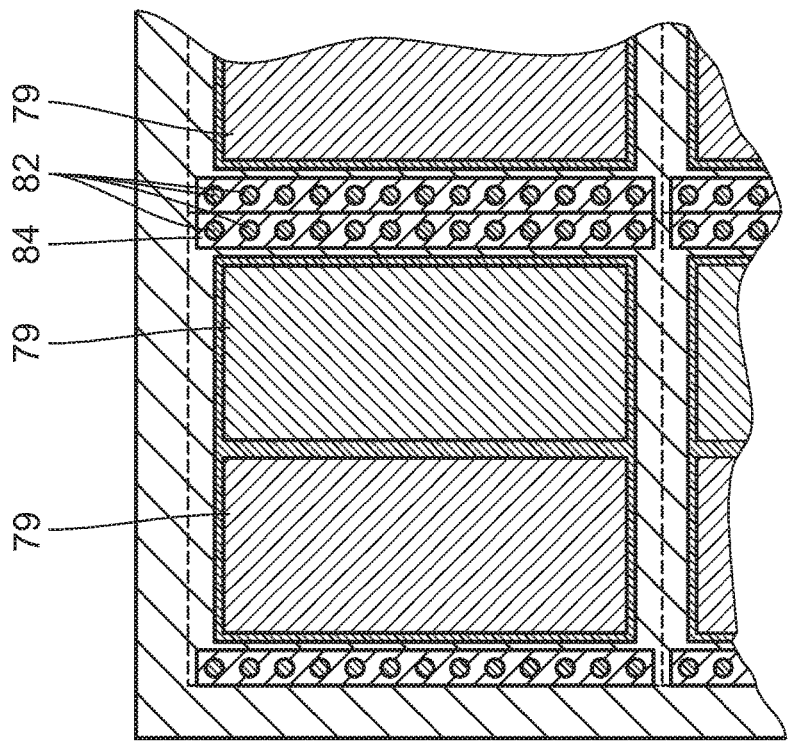
Figure 21:
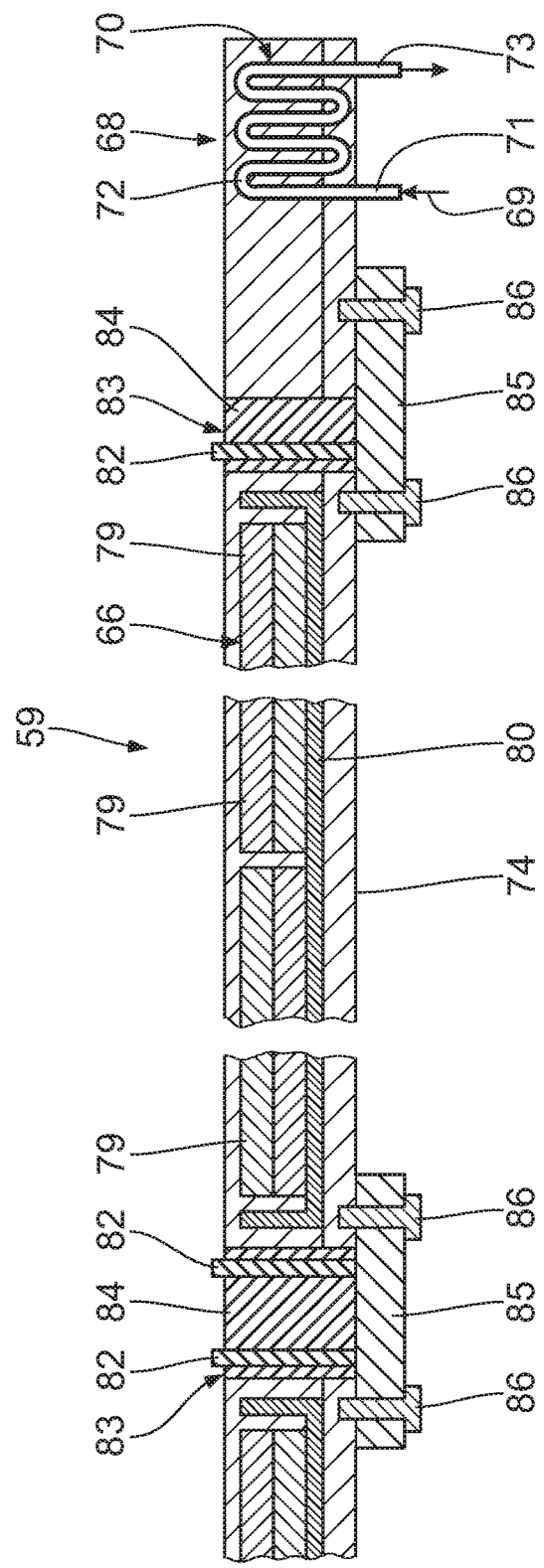
Figure 22:
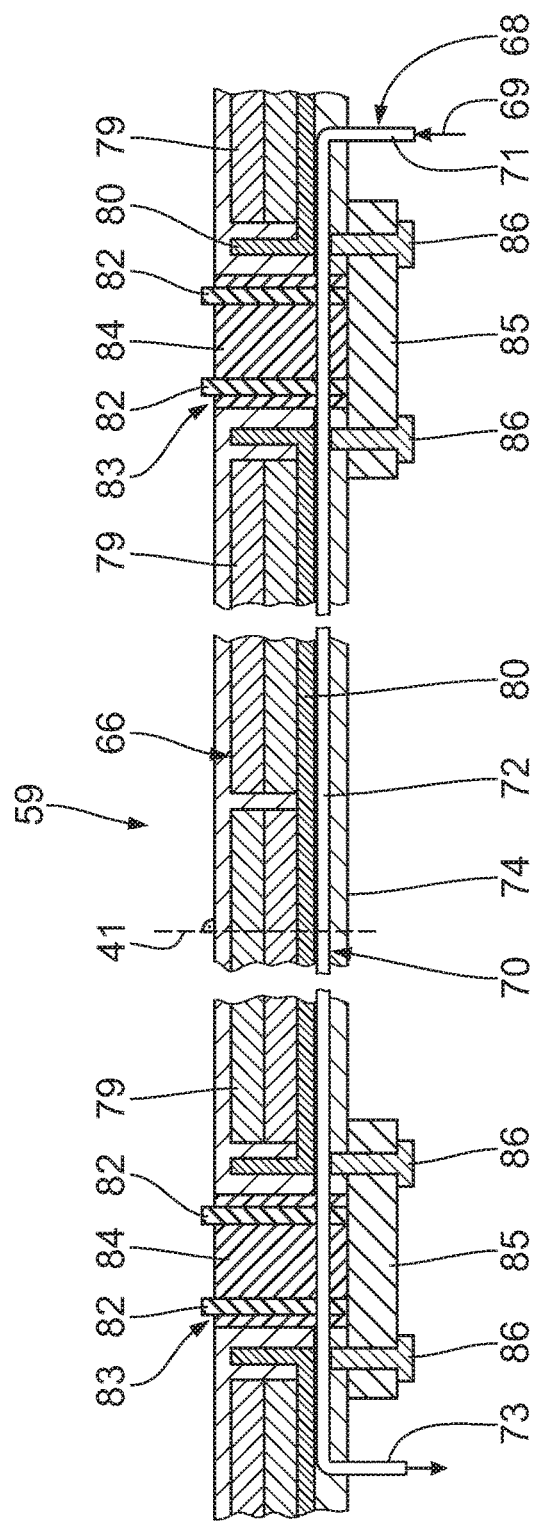
Figure 23:
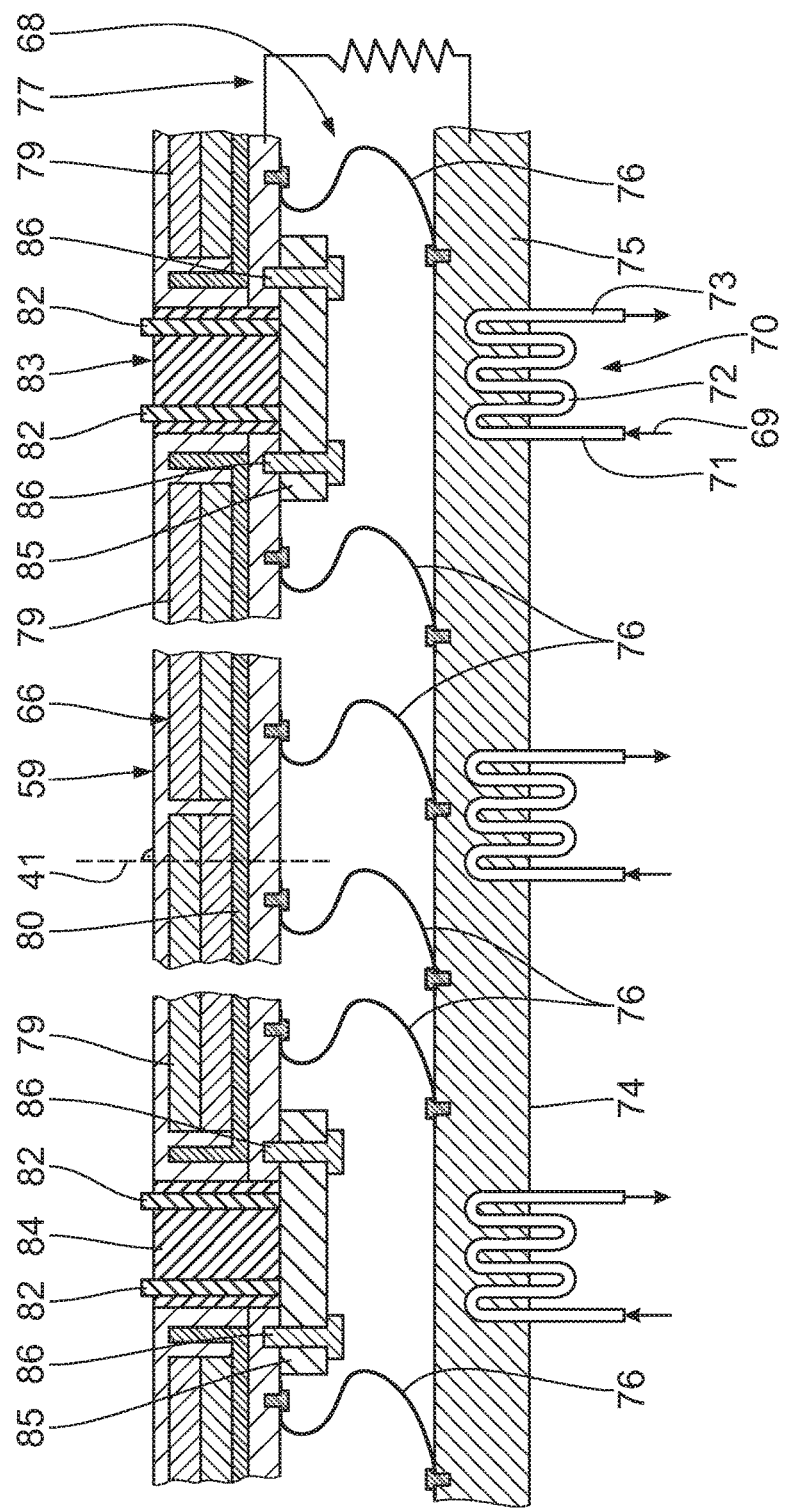
Figure 24:
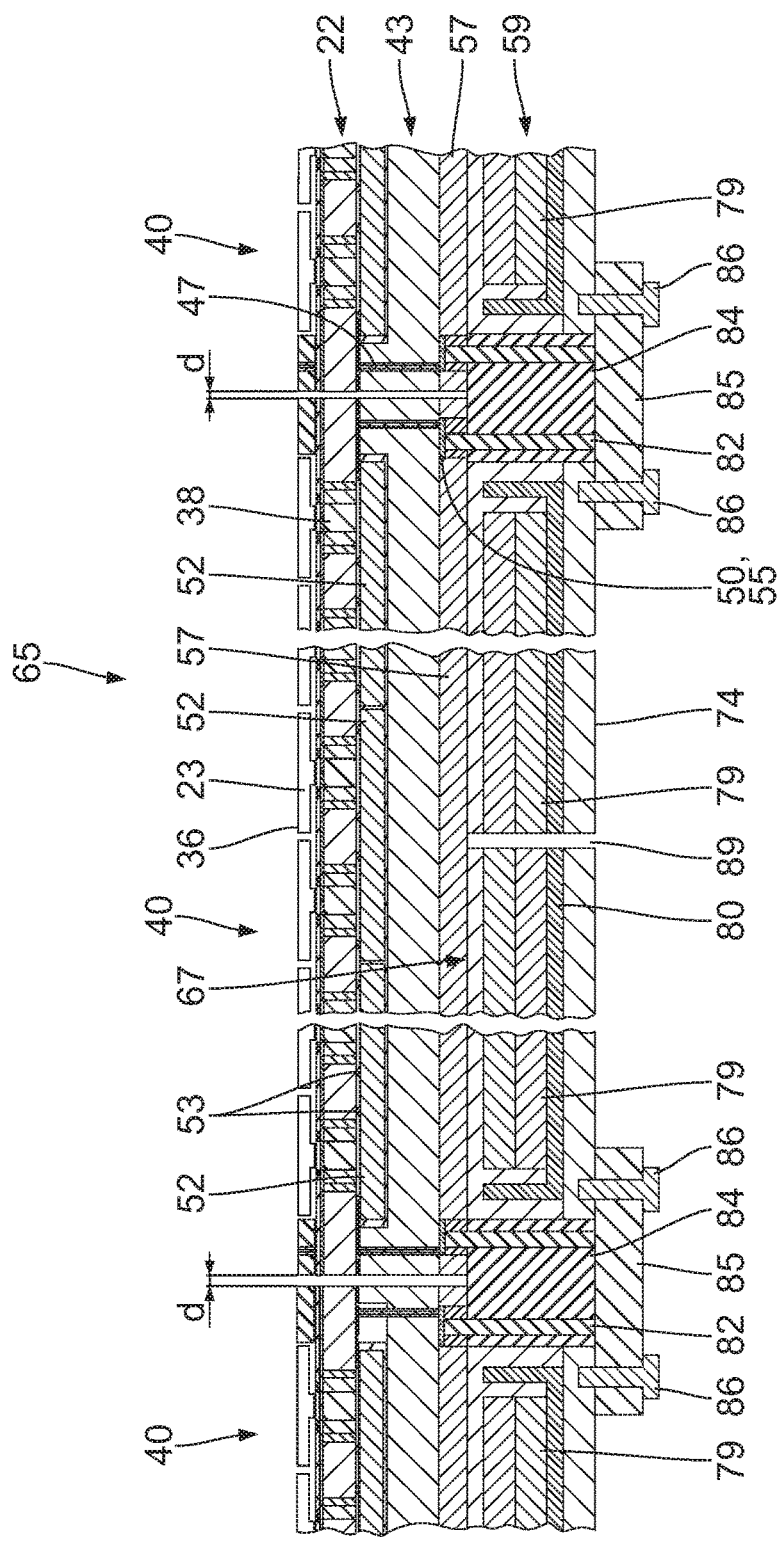
Figure 25:
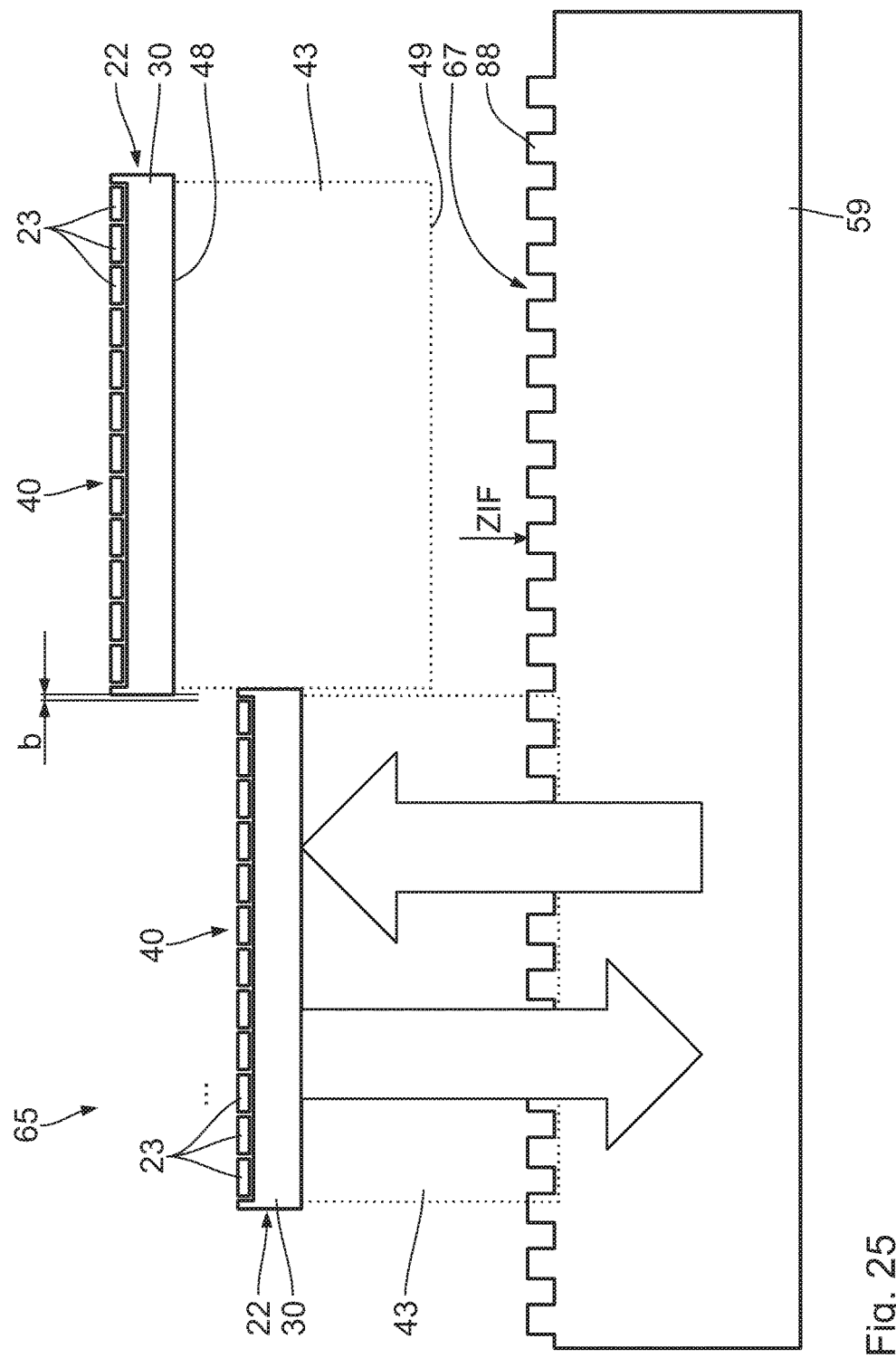
Figure 26:
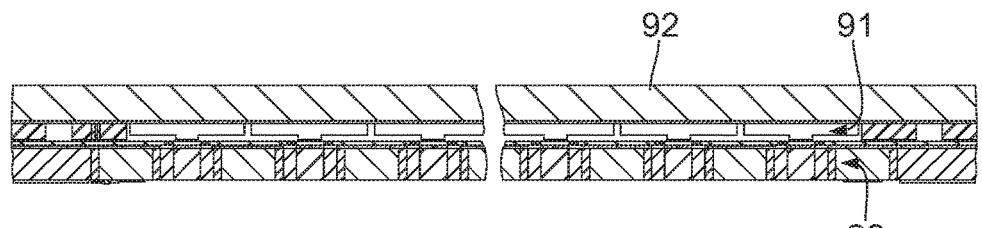
Figure 27:
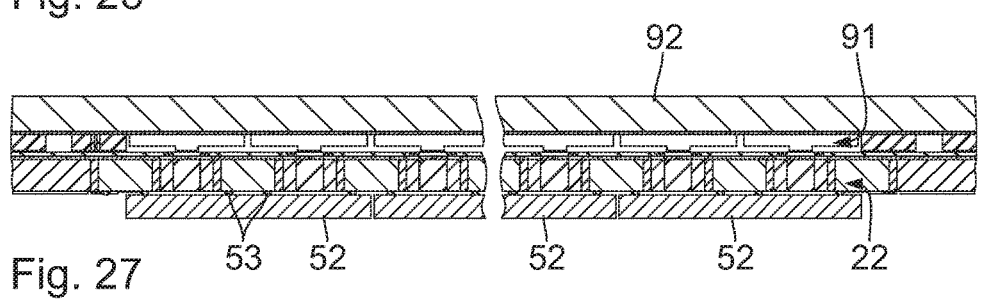
Figure 28:
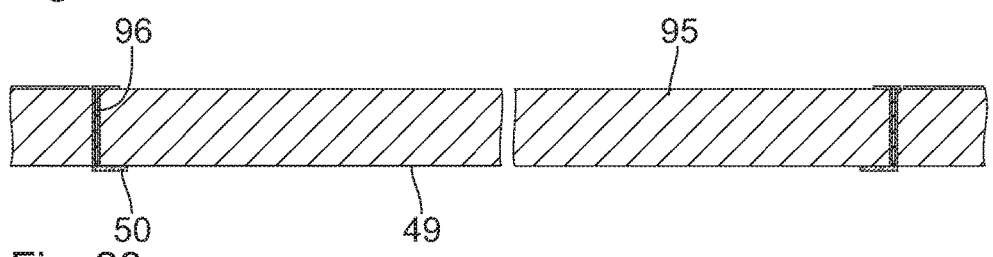
Figure 29:
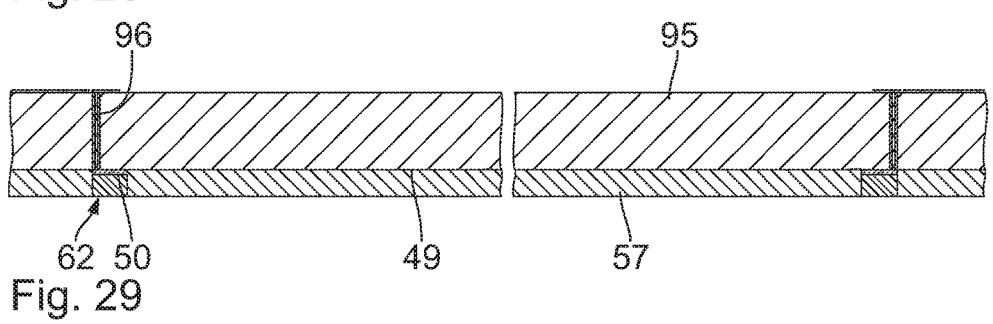
Figure 30:
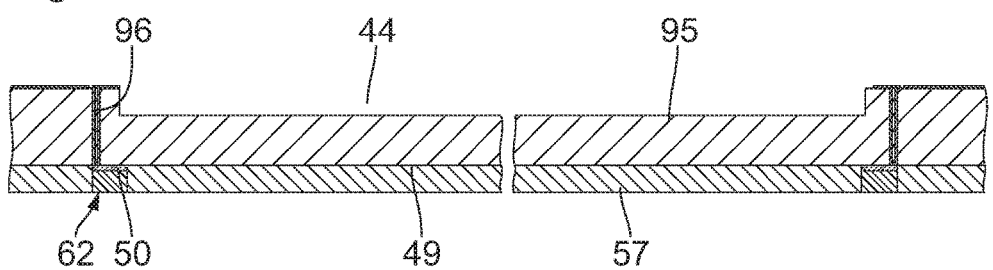
Figures 31, 32, 33, 34:
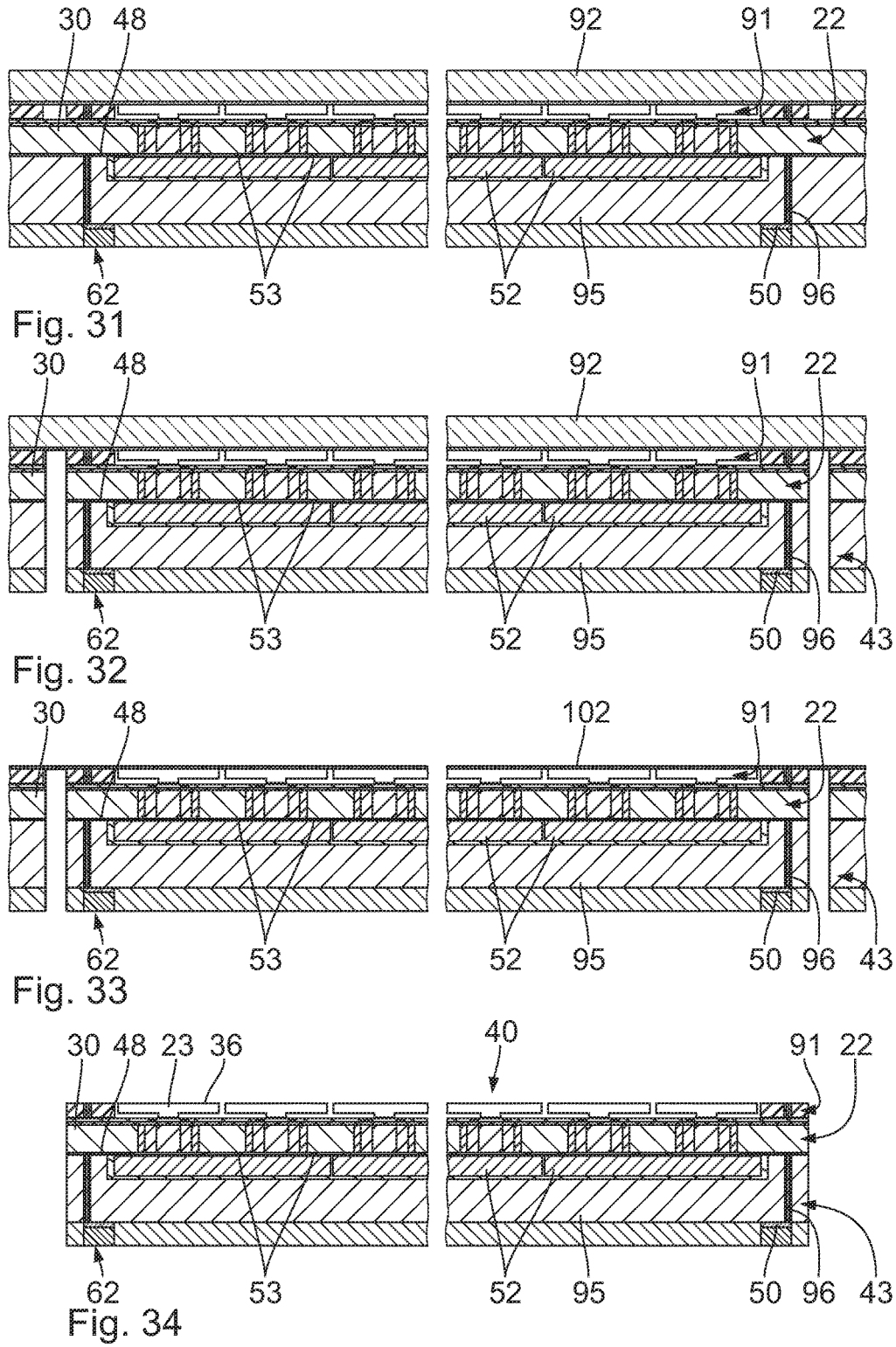
Figure 35:
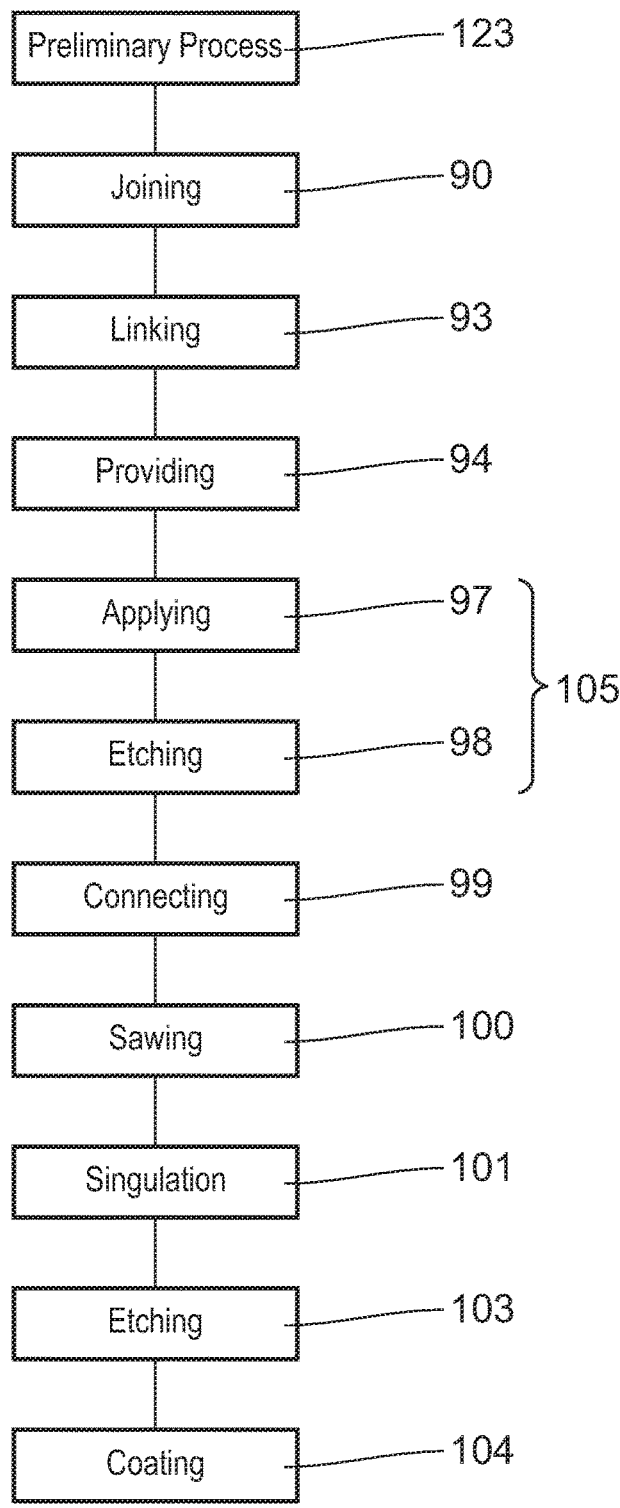
Figure 36:
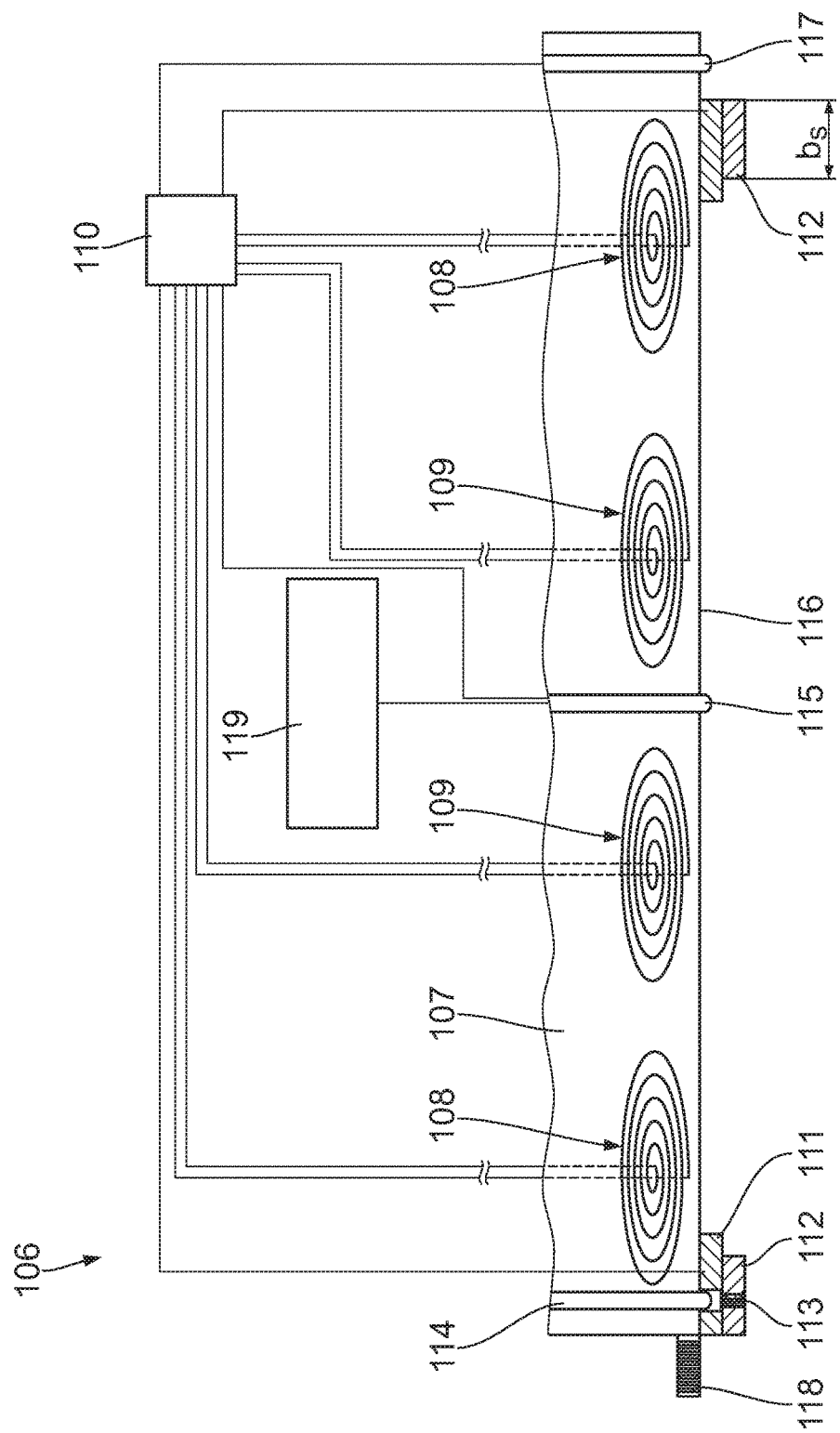
Figure 37:
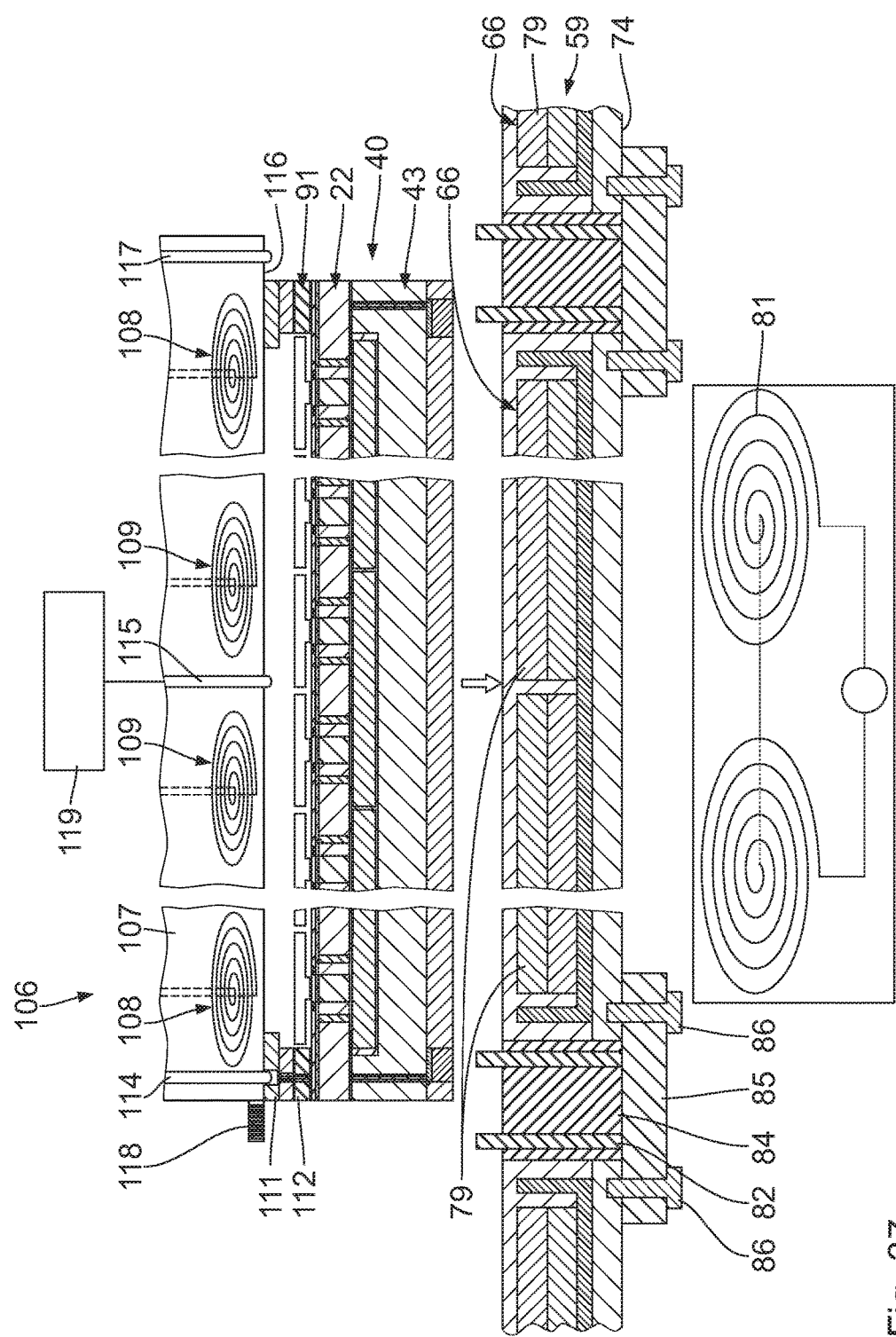
Figure 38:
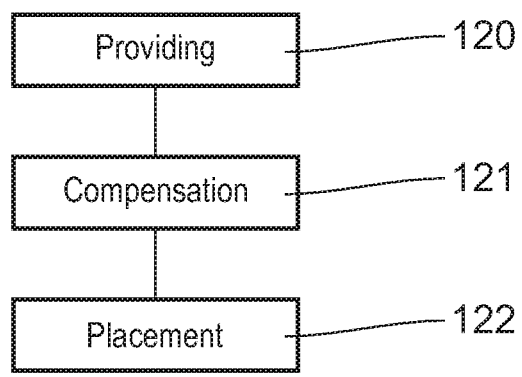
Figure 39:
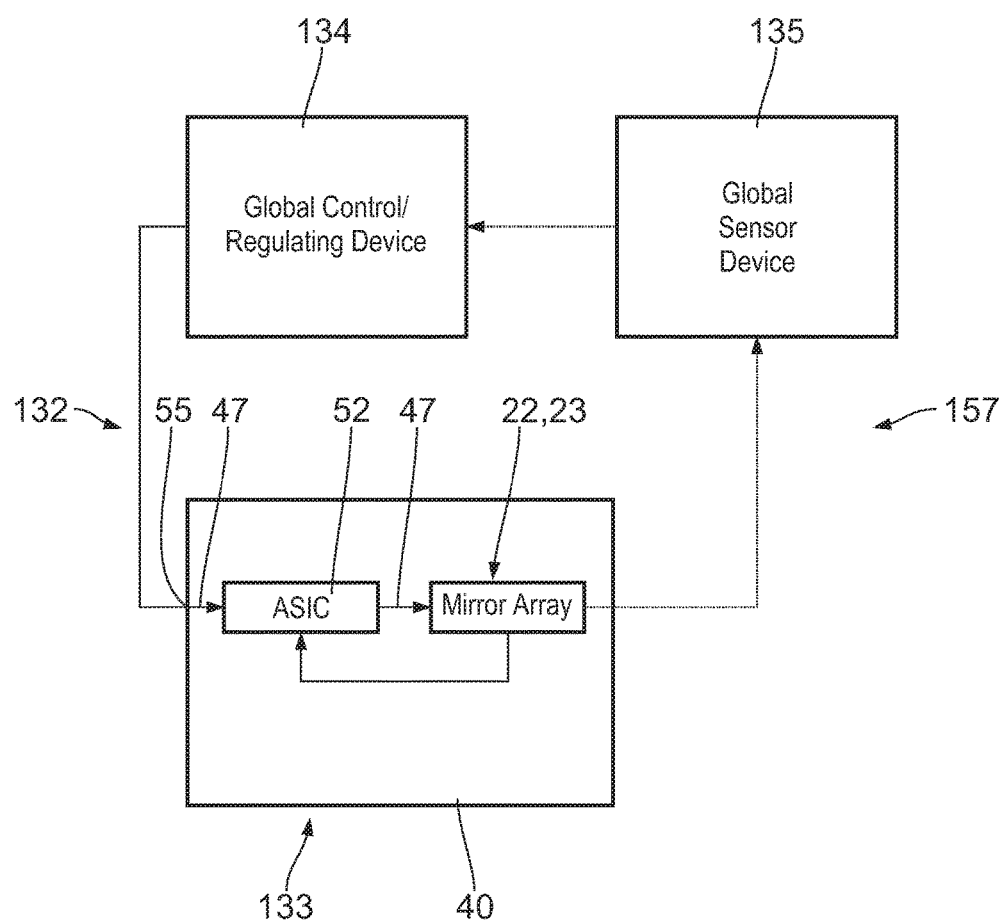
Figure 40:
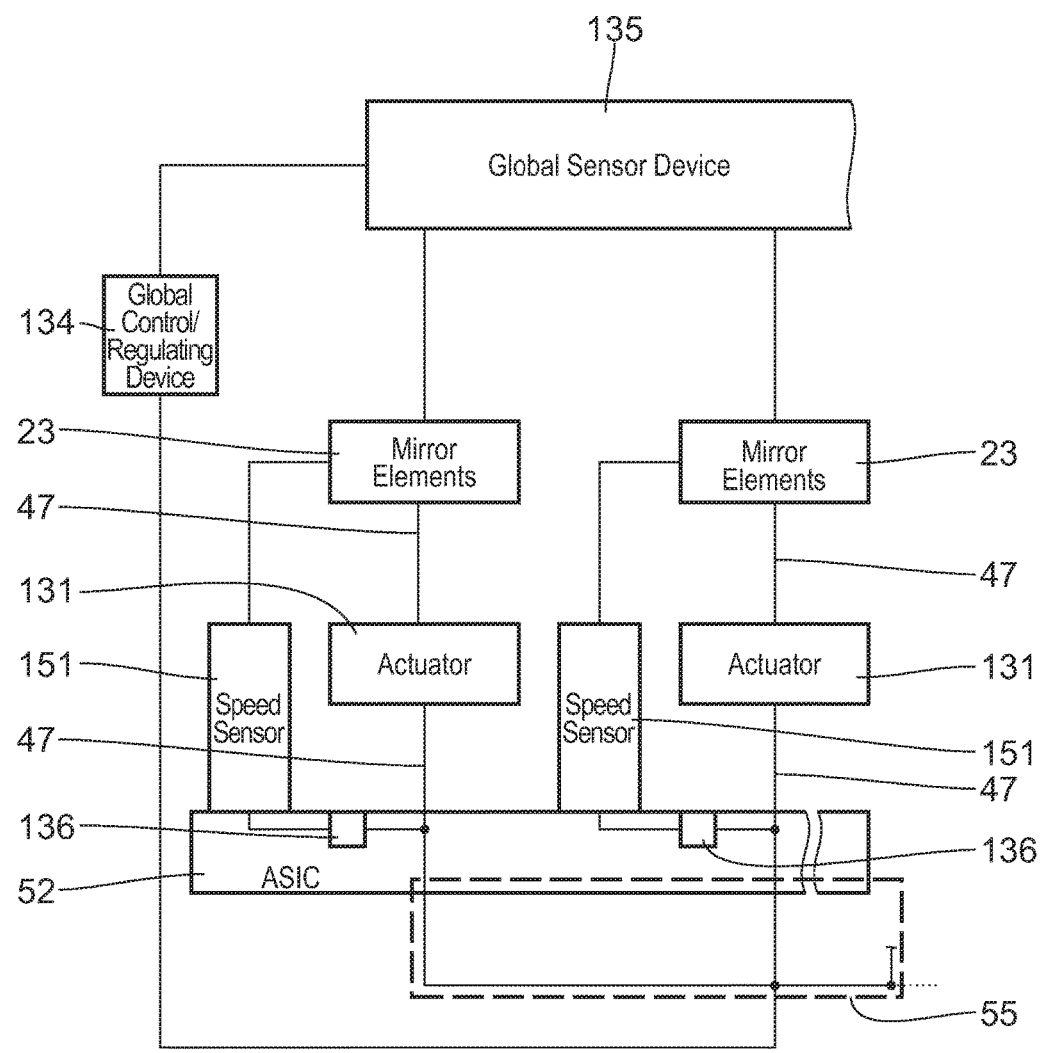
Figure 41:
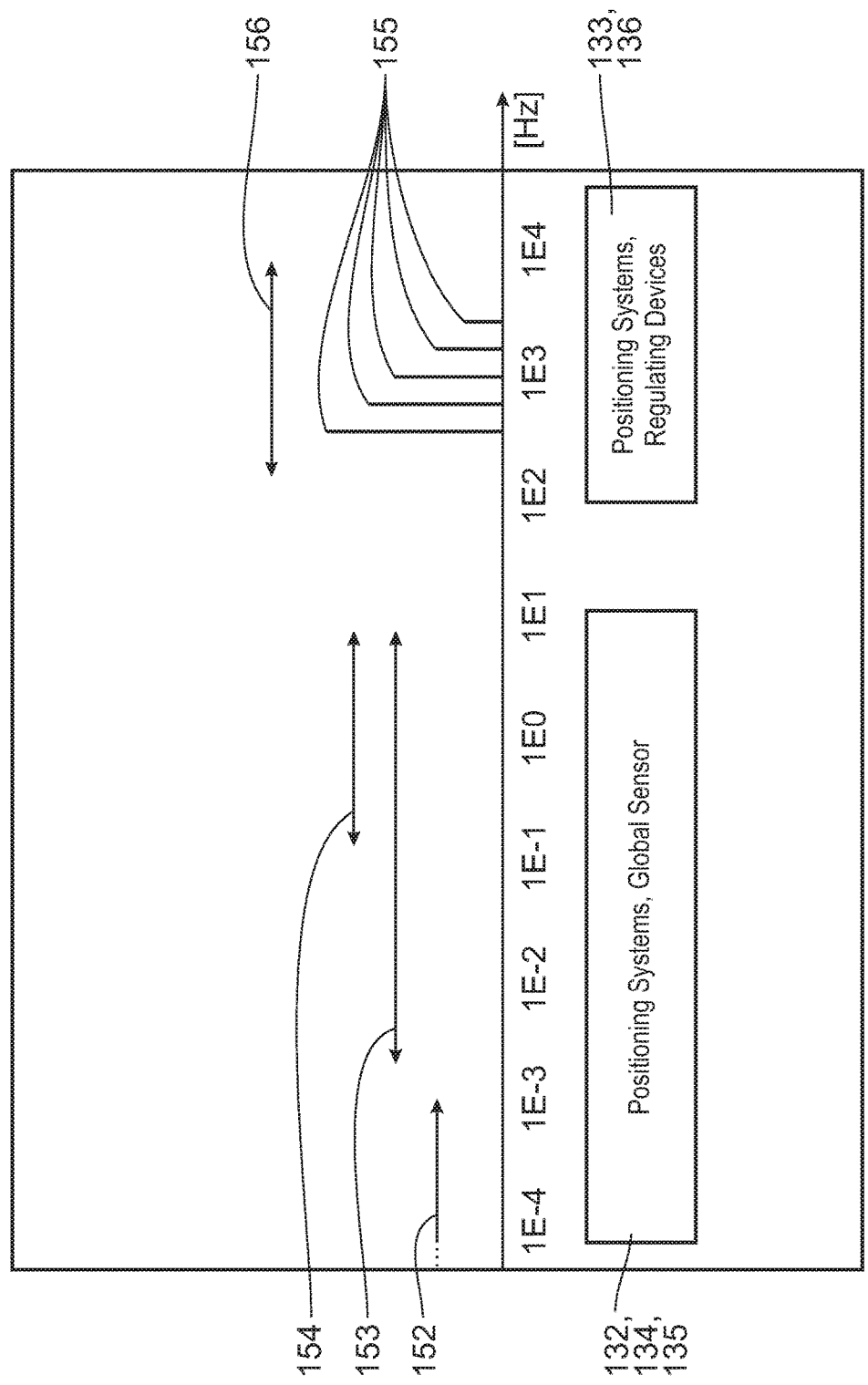
Figure 42:
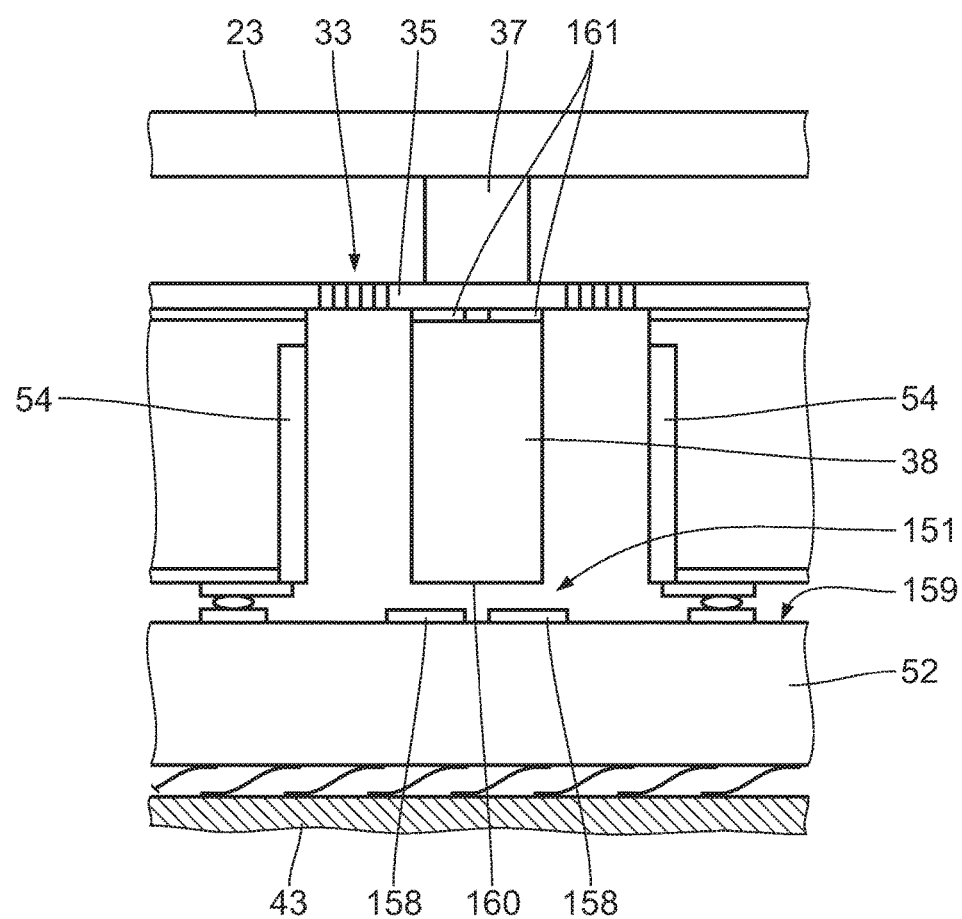
Figure 46:
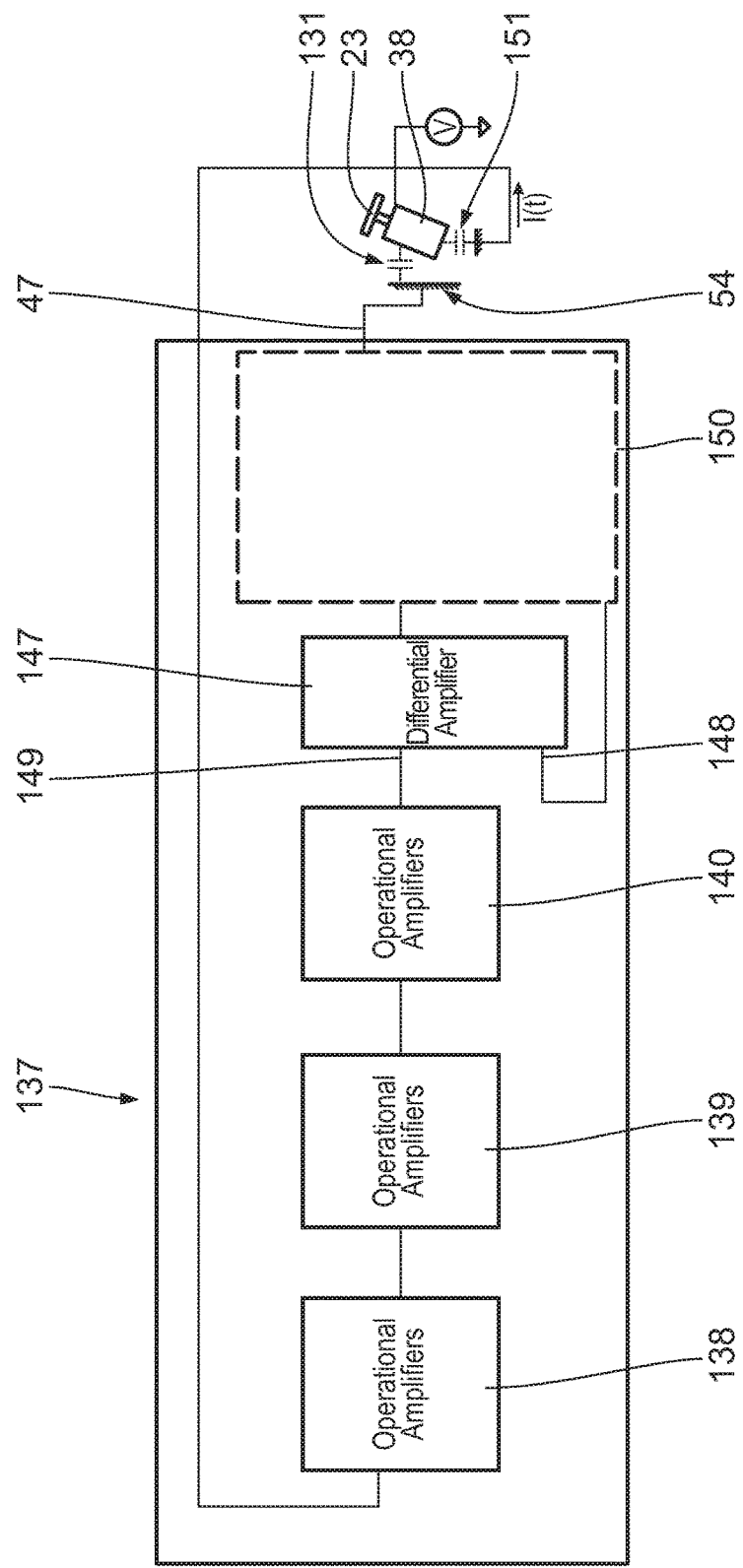
Figure 47:
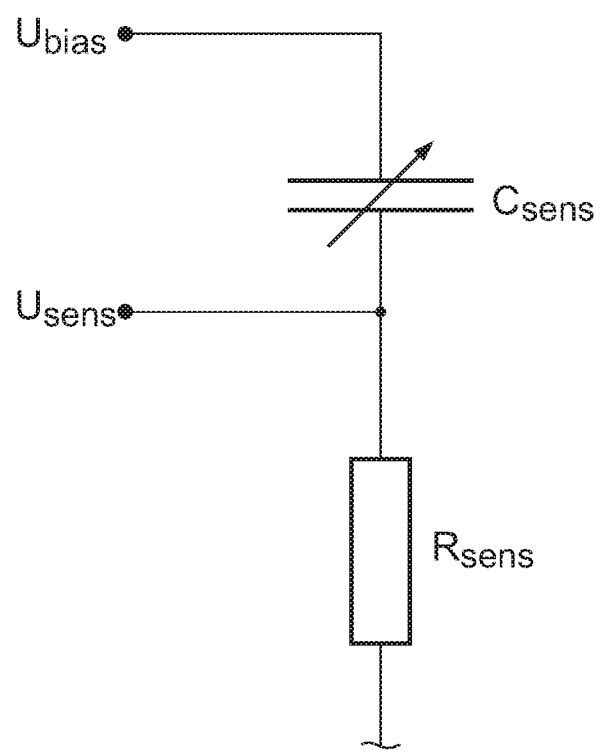
Figure 48:
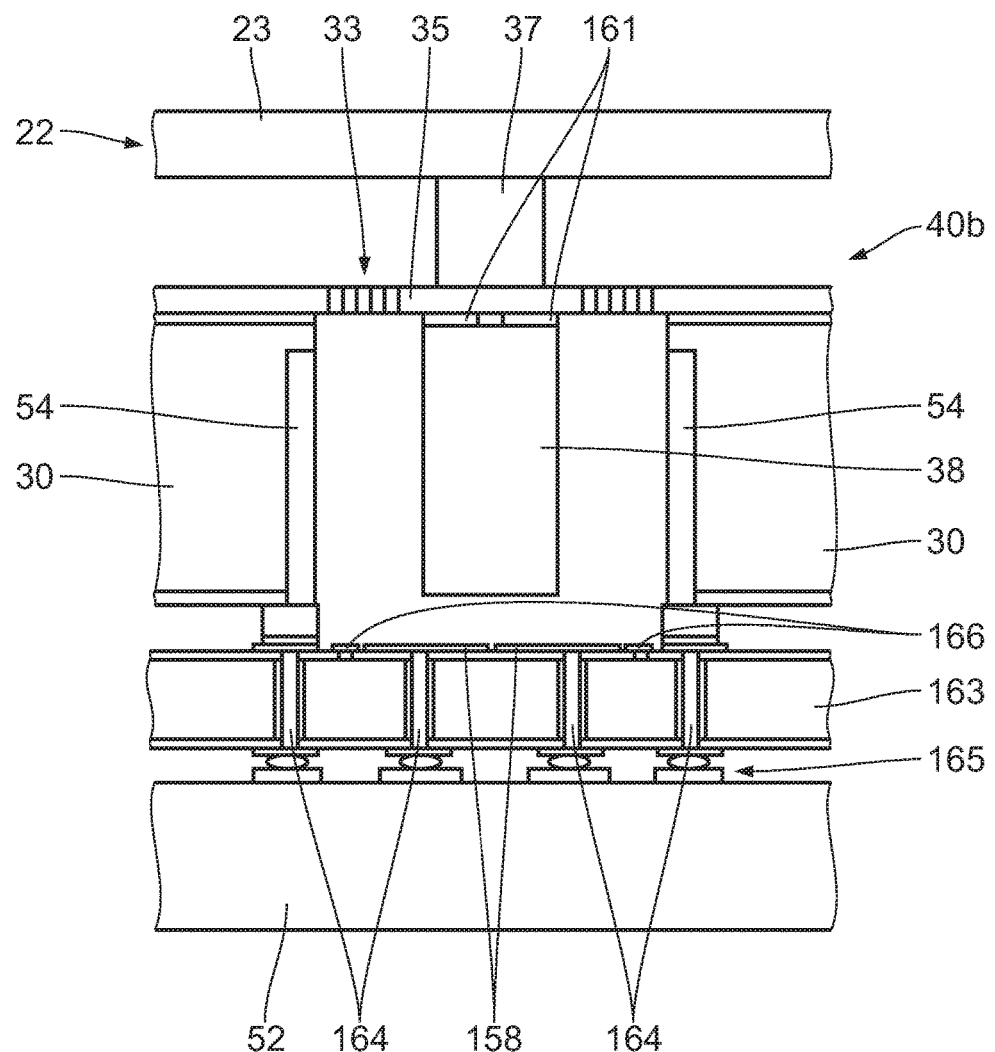
Figure 49:
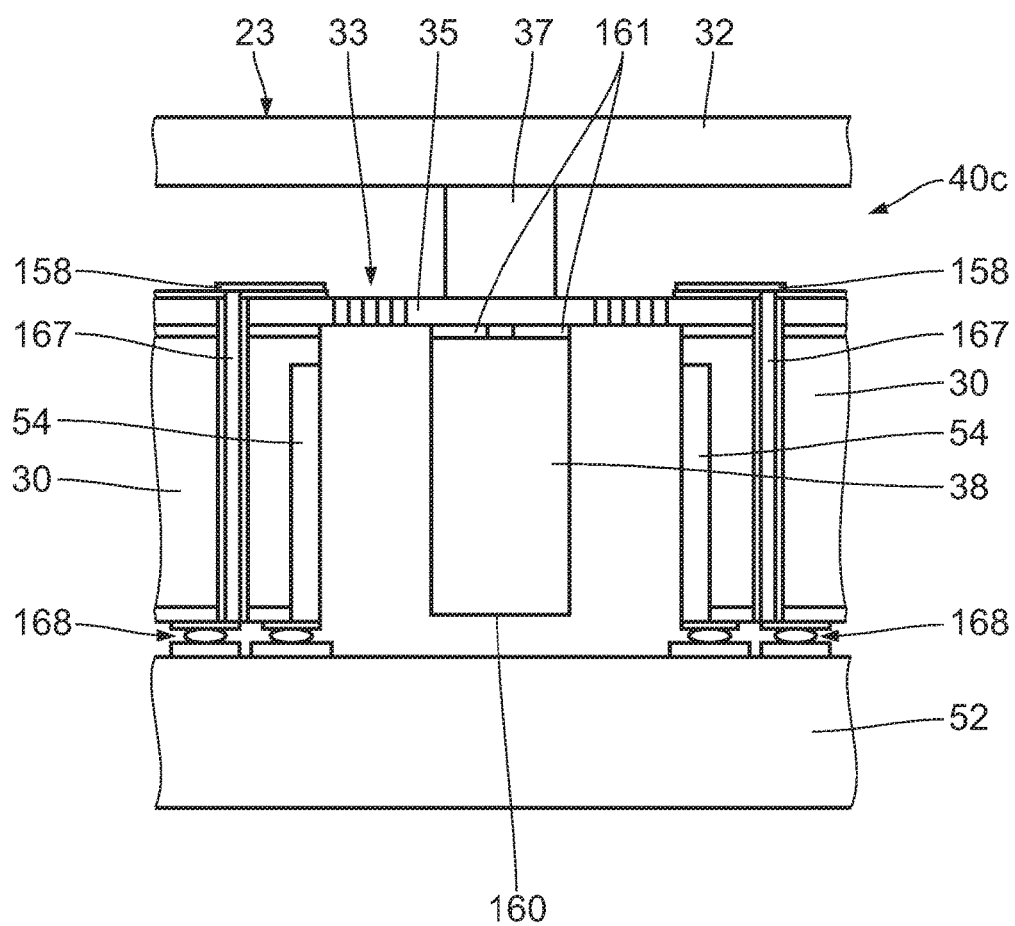

Further details and advantages of the invention will become apparent on the basis of the description of a plurality of exemplary embodiments with reference to the drawings, in which:

FIG. 1 shows a schematic illustration of a projection exposure apparatus for microlithography with an illumination system and a projection optical unit in meridional section, FIG. 2 shows an embodiment of an illumination systems of a projection exposure apparatus with a mirror array (MMA) and a pupil facet mirror illuminated by the latter, FIG. 3 schematically shows an exemplary plan view of the pupil facet mirror according to FIG. 2 with a pupil facet illumination corresponding to an illumination setting, FIG. 4 schematically shows the illumination system according to FIG. 2 with a channel assignment of the mirror array to the pupil facet mirror, which channel assignment can be generated by displacement of the mirror elements, FIG. 5 shows a schematic plan view of the pupil facet mirror according to FIG. 3 with a pupil facet illumination corresponding to an annular illumination setting, FIG. 6 shows a schematic illustration of two mirror elements of the mirror array according to FIGS. 2 and 4, the mirror elements lying alongside one another, FIG. 7 shows a schematic cross section through an embodiment of the optical component with a mirror array (MMA), FIG. 8 to FIG. 10 show schematic cross sections through further embodiments of the optical component with a mirror array (MMA), FIG. 11 to FIG. 15 show schematic illustrations of the carrying structure of the optical component for elucidating individual details, FIG. 16 shows an exemplary view of an optical assembly with four optical components with mirror arrays (MMA) arranged on a baseplate, FIG. 17 shows a cross section through an embodiment of the baseplate, FIG. 18 shows a schematic plan view of the baseplate according to FIG. 17, wherein the arrangement of the contact pins and of the magnets integrated into the baseplate is illustrated for elucidating individual details, FIG. 19 and FIG. 20 show two alternative embodiments of the arrangement of the sprung contacts pins in the baseplate and of a circuit board arranged on the rear side of the baseplate, FIG. 21 to FIG. 23 show schematic illustrations of the baseplate for elucidating different embodiments of the cooling system, FIG. 24 shows a cross section through the optical assembly with components arranged on the baseplate, FIG. 25 shows a schematic illustration of the arrangement of the components on the baseplate for elucidating further aspects of the invention, FIG. 26 to FIG. 34 show different intermediate products during the production of the optical component, FIG. 35 schematically shows method steps of a method sequence for producing the optical component, FIG. 36 schematically shows an illustration of the tool for handling the optical component, FIG. 37 schematically shows an illustration of the method for arranging a component on the baseplate for producing an assembly according to FIG. 24, FIG. 38 schematically shows method steps of a method sequence for producing an assembly according to FIG. 24, FIG. 39 shows a schematic illustration of the component with two separate control loops, FIG. 40 shows a further illustration of the component with two separate control loops, FIG. 41 shows an overview of the frequency range of the two control loops according to FIGS. 39 and 40, FIG. 42 shows a schematic cross section through a further embodiment of the optical component with a mirror array (MMA), FIG. 43a to FIG. 45a show schematic illustrations of the component according to FIG. 42 in different tilting positions of the mirror element, FIG. 43b to FIG. 45b show illustrations of the overlap of the moveable and rigid electrodes for different tilting positions of the mirror element corresponding to those illustrated in FIGS. 43a to 45a, FIG. 46 shows a circuit diagram for elucidating an exemplary embodiment of the feedback loop, FIG. 47 shows a simplified circuit diagram of the measurement electronics, FIG. 48 shows a schematic cross section through an optical component according to a further embodiment, and FIG. 49 shows a schematic illustration of a further embodiment of an optical component.

Firstly the basic construction of a projection exposure apparatus 1 will be described below with reference to the figures.

FIG. 1 schematically shows a projection exposure apparatus 1 for microlithography in meridional section. An illumination system 2 of the projection exposure apparatus 1 has, besides a radiation source 3, an illumination optical unit 4 for exposing an object field 5 in an object plane 6. The object field 5 can be fashioned rectangularly or arcuately with an x/y aspect ratio of 13/1, for example. In this case, a reflective reticle (not illustrated in FIG. 1) arranged in the object field 5 is exposed, the reticle bearing a structure to be projected by the projection exposure apparatus 1 for the production of micro- or nanostructured semiconductor components. A projection optical unit 7 serves for imaging the object field 5 into an image field 8 in an image plane 9. The structure on the reticle is imaged onto a light-sensitive layer of a wafer arranged in the region of the image field 8 in the image plane 9, the wafer not being illustrated in the drawing.

The reticle, which is held by a reticle holder (not illustrated), and the wafer, which is held by a wafer holder (not illustrated), are scanned synchronously in the y-direction during the operation of the projection exposure apparatus 1. Depending on the imaging scale of the projection optical unit 7, it is also possible for the reticle to be scanned in the opposite direction relative to the wafer.

With the aid of the projection exposure apparatus 1, at least one part of the reticle is imaged onto a region of a light-sensitive layer on the wafer for the lithographic production of a micro- or nanostructured component, in particular of a semiconductor component, for example of a microchip. Depending on the embodiment of the projection exposure apparatus 1 as a scanner or as a stepper, the reticle and the wafer are moved in a tempo-rally synchronized manner in the y-direction continuously in scanner operation or step by step in stepper operation.

The radiation source 3 is an EUV radiation source having an emitted used radiation in the range of between 5 nm and 30 nm. This can involve a plasma source, for example a GDPP source (gas discharge produced plasma) or an LPP source (laser produced plasma). Other EUV radiation sources, for example those based on a synchrotron or on a free electron laser (FEL), are also possible.

EUV radiation 10 emerging from the radiation source 3 is concentrated by a collector 11. A corresponding collector is known for example from EP 1 225 481 A. Downstream of the collector 11, the EUV radiation 10 propagates through an intermediate focal plane 12 before it impinges on a field facet mirror 13 having a multiplicity of field facets 13a. The field facet mirror 13 is arranged in a plane of the illumination optical unit 4 which is optically conjugate with respect to the object plane 6.

The EUV radiation 10 is hereinafter also designated as used radiation, illumination light or as imaging light.

Downstream of the field facet mirror 13, the EUV radiation 10 is reflected by a pupil facet mirror 14 having a multiplicity of pupil facets 14a. The pupil facet mirror 14 lies either in the entrance pupil plane of the illumination optical unit 7 or in a plane that is optically conjugate with respect thereto. The field facet mirror 13 and the pupil facet mirror 14 are constructed from a multiplicity of individual mirrors, which will be described in even greater detail below. In this case, the subdivision of the field facet mirror 13 into individual mirrors can be such that each of the field facets 13a, which by themselves illuminate the entire object field 5, is represented by exactly one of the individual mirrors. Alternatively, it is possible for at least some or all of the field facets 13a to be constructed by a plurality of such individual mirrors. The same correspondingly applies to the configuration of the pupil facets 14a of the pupil facet mirror 14 respectively assigned to the field facets 13a, which pupil facets can in each case be formed by a single individual mirror or by a plurality of such individual mirrors.

The EUV radiation 10 impinges on the two facet mirrors 13, 14 at an angle of incidence, measured with normal incidence with respect to the mirror surface, which is less than or equal to 25°. Therefore, the EUV radiation 10 is applied to the two facet mirrors 13, 14 in the range of normal incidence operation. Application with grazing incidence is also possible. The pupil facet mirror 14 is arranged in a plane of the illumination optical unit 4 which constitutes a pupil plane of the projection optical unit 7 or is optically conjugate with respect to a pupil plane of the projection optical unit 7. With the aid of the pupil facet mirror 14 and an imaging optical assembly in the form of a transmission optical unit 15 having mirrors 16, 17 and 18 designated in the order of the beam path for the EUV radiation 10, the field facets of the field facet mirror 13 are imaged into the object field 5 in a manner superimposed on one another. The last mirror 18 of the transmission optical unit 15 is a mirror for grazing incidence ("grazing incidence mirror"). The transmission optical unit 15 together with the pupil facet mirror 14 is also designated as subsequent optical unit for transferring the EUV radiation 10 from the field facet mirror 13 toward the object field 5. The illumination light 10 is guided from the radiation source 3 toward the object field 5 via a plurality of illumination channels. Each of the illumination channels is assigned a field facet 13a of the field facet mirror 13 and a pupil facet 14a of the pupil facet mirror 14 disposed downstream thereof. The individual mirrors of the field facet mirror 13 and of the pupil facet mirror 14 can be tiltable by an actuator system, with the result that a change in the assignment of the pupil facets 14a to the field facets 13a and accordingly a changed configuration of the illumination channels can be achieved. This results in different illumination settings which differ in the distribution of the illumination angles of the illumination light 10 over the object field 5.

In order to facilitate the explanation of positional relationships, inter alia a global Cartesian xyz coordinate system is used hereinafter. The x-axis runs perpendicularly to the plane of the drawing toward the observer in FIG. 1. The y-axis runs toward the right in FIG. 1. The z-axis runs upward in FIG. 1.

A local Cartesian xyz coordinate system is depicted in selected figures from among the subsequent figures, wherein the x-axis runs parallel to the x-axis according to FIG. 1 and the y-axis together with the x-axis spans the optical surface of the respective optical element.

FIG. 2 shows an alternative configuration of an illumination system 19 for the projection exposure apparatus 1. Components corresponding to those which have already been explained above with reference to FIG. 1 bear the same reference numerals and will not be discussed in detail again.

Used radiation 10 emerging from the radiation source 3, which can likewise be embodied as an LPP source, is firstly collected by a first collector 20. The collector 20 can be a parabolic mirror, which images the radiation source 3 into the intermediate focal plane 12 or focuses the light from the radiation source 3 onto the intermediate focus in the intermediate focal plane 12. The collector 20 can be operated such that the used radiation 10 is applied to it at angles of incidence of close to 0°. The collector 20 is then operated close to normal incidence and therefore also designated as a normal incidence (NI) mirror. A collector operated with grazing incidence can also be used instead of the collector 20.

Disposed downstream of the intermediate focal plane 12 is a field facet mirror 21 in the form of a multi- or micro-mirror array (MMA) as an example of an optical assembly for guiding the used radiation 10, that is to say the EUV radiation beam. The multi- or micro-mirror array (MMA) is also designated just as mirror array 22 hereinafter. The field facet mirror 21 is embodied as a microelectromechanical system (MEMS). It has a multiplicity of individual mirrors arranged in matrix-like fashion in rows and columns in an array. The individual mirrors are also designated as mirror elements 23 hereinafter. The mirror elements 23 are designed to be tiltable by an actuator system, as will also be explained below. Overall, the field facet mirror 21 has approximately 100 000 of the mirror elements 23. Depending on the size of the mirror elements 23, the field facet mirror 21 can also have for example 1000, 5000, 7000 or else hundreds of thousands of mirror elements 23, for example 500 000 mirror elements 23.

A spectral filter can be arranged upstream of the field facet mirror 21, the spectral filter separating the used radiation 10 from other wavelength components—not usable for the projection exposure—of the emission of the radiation source 3. The spectral filter is not illustrated.

Used radiation 10 having a power of 840 W and a power density of 6.5 kW/m$^2$ is applied to the field facet mirror 21. The used radiation 10 can also have a different power and/or power density.

The entire individual-mirror array of the facet mirror 21 has a diameter of 500 mm and is designed in a manner densely packed with the mirror elements 23. The area coverage, also designated as degree of filling or integration density, of the complete field facet array by the mirror elements 23 is at least 70%. The mirror elements 23 represent, insofar as a field facet 21a is realized by in each case exactly one mirror element 23, apart from a scaling factor, the form of the object field 5. The facet mirror 21 can be formed from 500 mirror elements 23 respectively representing a field facet 21a and having a dimension of approximately 5 mm in the y-direction and 100 mm in the x-direction. As an alternative to the realization of each field facet 21a by exactly one mirror element 23, each of the field facets 21a can be formed by groups of smaller mirror elements 23. A field facet 21a having dimensions of 5 mm in the y-direction and of 100 mm in the x-direction can be constructed e.g. via a 1×20 array of mirror elements 23 having the dimensions of 5 mm×5 mm through to a 10×200 array of mirror elements 23 having the dimensions of 0.5 mm×0.5 mm. According to the invention, the assignment of the mirror elements 23 to a field facet 21a is flexible. The field facets 21a are in particular first defined by suitable driving of the mirror elements 23. The form of the mirror elements 23 can be, in particular, independent of the form of the macroscopic field facets.

The used light 10 is reflected from the mirror elements 23 of the facet mirror 21 toward the pupil facet mirror 14. The pupil facet mirror 14 has approximately 2000 static pupil facets 14a. The latter are arranged in a plurality of concentric rings alongside one another, such that the pupil facets 14a of the innermost ring are configured in sector-shaped fashion and the pupil facets 14a of the rings directly adjacent thereto are configured in ring-sector-shaped fashion. In a quadrant of the pupil facet mirror 14, pupil facets 14a can be present alongside one another in each of the rings 12. Each of the pupil facets 14a can be embodied as a mirror array 22.

The used light 10 is reflected from the pupil facets 14a toward a reflective reticle 24 arranged in the object plane 6.

The projection optical unit 7 then follows, as explained above in connection with the projection exposure apparatus according to FIG. 1.

A transmission optical unit 15 can again be provided between the facet mirror 14 and the reticle 24, as explained above in connection with the illumination optical unit 4 according to FIG. 1.

FIG. 3 shows by way of example an illumination of the pupil facets 14a of the pupil facet mirror 14, with which the conventional illumination setting according to FIG. 2 can approximately be achieved. In the two inner pupil facet rings of the pupil facet mirror 14, every second one of the pupil facets 14a is illuminated in a circumferential direction. This alternating illumination illustration in FIG. 3 is intended to symbolize the fact that the filling density realized in the case of this illumination setting is lower than in the case of an annular illumination setting by a factor of 2. A homogeneous illumination distribution is likewise sought in the two inner pupil facet rings, but with occupation density lower by a factor of 2. The two outer pupil facet rings illustrated in FIG. 3 are not illuminated.

FIG. 4 schematically shows the conditions in the case of the illumination optical unit 4, insofar as an annular illumination setting is set there. The mirror elements 23 of the field facet mirror 21 are tilted by an actuator system with the aid of actuators (which will also be explained below) in such a way that on the pupil facet mirror 14 an outer ring of the ring-sector-shaped pupil facet 14a is illuminated with used light 10. This exemplary illumination of the pupil facet mirror 14 is illustrated in FIG. 5. The tilting of the mirror elements 23 for generating this illumination is indicated by way of example in FIG. 4 on the basis of the example of one of the mirror elements 23.

For changing over the illumination settings according to FIGS. 2 to 5, the mirror elements 23 can be pivoted by a tilting angle. They are pivotable in particular by a tilting angle in the range of at least ±50 mrad, in particular at least ±80 mrad, in particular ±100 mrad. The respective tilting position can be complied with in this case with an accuracy of at least 0.2 mrad, in particular at least 0.1 mrad, in particular at least 0.05 mrad.

The mirror elements 23 bear multilayer coatings for optimizing their reflectivity at the wavelength of the used radiation 10. The temperature of the multilayer coatings should not exceed 425 K during the operation of the projection exposure apparatus 1. This is achieved via a construction of the mirror elements 23 which is explained by way of example below. The mirror elements 23 of the illumination optical unit 4, as indicated schematically in FIG. 2, are accommodated in an evacuatable chamber 25. FIG. 2 merely schematically indicates a boundary wall 26 of the evacuatable chamber 25. The chamber 25 communicates with a vacuum pump 29 via a fluid line 27, in which a shutoff valve 28 is accommodated. The operating pressure in the evacuatable chamber 25 is a few Pa (partial pressure $H_2$). All other partial pressures are distinctly below $10^{-7}$ mbar.

The mirror elements 23 are arranged in a substrate 30. The latter is mechanically connected to a mirror body 32 via a heat-conducting section 31. Part of the heat-conducting section 31 is an articulation body 33 that permits the mirror body 32 to be tilted relatively to the substrate 30. The articulation body 33 can be embodied as a solid-state articulation that permits the mirror body 32 to be tilted about defined tilting axes, for example about one or about two, in particular mutually perpendicularly arranged, tilting axes. The articulation body 33 has an outer holding ring 34 fixed to the substrate 30. Furthermore, the articulation body 33 has an inner holding body 35 connected to the outer holding ring 34 in an articulated manner. The holding body is arranged centrally below a reflection surface 36 of the mirror element 23. A spacer 37 is arranged between the central holding body 35 and the reflection surface 36.

Heat deposited in the mirror body 32, in particular heat generated by absorption of the impinging used radiation 10, is dissipated via the heat-conducting section 31, namely via the spacer 37, the central holding body 35 and the articulation body 33 and the outer holding ring 34, toward the substrate 30. A thermal power density of at least 10 $kW/m^2$, in particular at least 30 $kW/m^2$, in particular at least 50 $kW/m^2$, can be dissipated to the substrate 30 via the heat-conducting section 31. The thermal power dissipated to the substrate 30 can be, depending on the mirror element 23, at least 2.5 mW, in particular at least 7.5 mW, in particular at least 12.5 mW. The heat-conducting section 31 is alternatively designed for dissipating a thermal power density of at least 1 $kW/m^2$, or a power of at least 0.25 mW absorbed by the mirror body 32, to the substrate 30. The absorbed power can also be, alongside absorbed power of the used radiation 10 from the radiation source 3, absorbed electrical power, for example.

On the opposite side of the holding body 35 relative to the spacer 37, an actuator pin 38 is arranged on the holding body. The actuator pin 38 can have a smaller external diameter than the spacer 37. The actuator pin 38 can also have the same diameter as, or a larger diameter than, the spacer 37.

The substrate 30 forms a sleeve surrounding the actuator pin 38. In each case a total of three electrodes 54 are integrated in the sleeve, which electrodes are arranged in a manner electrically insulated from one another and extending over approximately just less than 120° in each case in a circumferential direction. The electrodes 54 constitute counterelectrodes with respect to the actuator pin 38, which is embodied as an electrode pin in this embodiment. In this case, the actuator pin 38 can be embodied in particular as a hollow cylinder. In principle, it is also possible to provide a different number of electrodes 54 per actuator pin 38. In particular, four or more electrodes 54 can be provided per actuator pin 38. By generating a potential difference between one or more of the electrodes 54 and the actuator pin 38, it is possible to generate an electrostatic force on the actuator pin 38, which force, as illustrated by way of example in the right-hand half of FIG. 6, can lead to a deflection of the mirror element 23.

The substrate 30 can be formed, in particular, from a silicon wafer, on which an entire array of mirror elements 23 is arranged.

The actuator pin 38 can also be part of a Lorentz actuator. In this case, a permanent magnet is arranged at the free end of the actuator pin 38. The permanent magnet can be oriented in such a way that a north pole and a south pole thereof are arranged alongside one another along the actuator pin 38. A Lorentz actuator of this type is known for example from U.S. Pat. No. 7,145,269 B2. It can be produced in a batch process as a microelectromechanical system (MEMS). A force density of 20 kPa can be achieved with a Lorentz actuator of this type. The force density is defined as the ratio of the actuator force to that area of the actuator over which the actuator force acts. The cross section of the actuator pin 38 can serve as a measure of that side area of the actuator over which the actuator force acts and which is to be inherently considered.

As an alternative to the embodiment as Lorentz actuators, the actuators for tilting the mirror elements 23 can be embodied as reluctance actuators, for example in the manner of WO 2007/134 574 A, or as piezo-actuators. A force density of 50 kPa can be achieved with a reluctance actuator. Depending on the configuration, a force density of 50 kPa to 1 MPa can be achieved with a piezo-actuator.

For further details in particular of the arrangement of the individual mirrors 23 in the substrate 30 and their pivotability via the actuators and the embodiment of the articulation bodies and heat-conducting sections 31, reference should be made to WO 2010/049 076 A2.

Further aspects and details of an optical component 40 with the mirror array 22 are described below with reference to FIGS. 7 to 15. The mirror array 22 having the mirror elements 23 and the substrate 30 has a total surface extending perpendicularly to a surface normal 41. It comprises a multiplicity of the mirror elements 23, which each have a reflection surface 36 and two degrees of freedom of displacement. Generally, the mirror elements 23 have at least one degree of freedom of displacement. They can also have three or more degrees of freedom of displacement. They have in particular at least one degree of freedom of tilting, preferably at least two degrees of freedom of tilting. They can in particular also have a degree of freedom of translation. The displacements which can be effected via the actuators can be linearly independent in pairs. However, they are not necessarily linearly independent. It is possible, for example, as described above, to arrange three or more electrodes 54 equidistantly in a plane around the actuator pin 38.

The reflection surface 36 can have an extent of 0.5 mm×0.5 mm, 1 mm×1 mm, 4 mm×4 mm, 8 mm×8 mm or 10 mm×10 mm. It can also deviate from the square shape. Other dimensions of the reflection surface 36 are likewise possible.

The mirror array 22 has in particular at least 4, in particular at least 16, in particular at least 64, in particular at least 256, in particular at least 1024 mirror elements 23. The latter are preferably arranged in a rectangular, in particular a square, matrix. The mirror elements 23 have a square cross section. They can also be embodied in triangular, rectangular or hexagonal fashion, in principle. They are embodied as parquet elements. The totality of the mirror elements 23 forms a parqueting of a total reflection surface of the mirror array 22. The parqueting is a tesselation, in particular. The mirror elements 23 are arranged in particular in a densely packed manner. The mirror array has in particular a degree of filling of at least 0.85, in particular at least 0.9, in particular at least 0.95. In this case, the degree of filling, in some instances also designated as integration density, designates the ratio of the total reflection surface, that is to say the sum of the reflection surfaces 36 of all the mirror elements 23 of the mirror array 22, to the total surface of the array 22.

The reflection surface 36 of the mirror elements 23 is embodied as flat. In principle, it can also be embodied as concave or convex or as a freeform surface.

The reflection surface 36 of the mirror elements 23 is provided in particular with a (multilayer) coating for optimizing its reflectivity at the wavelength of the used radiation 10. The multilayer coating enables, in particular, the reflection of used radiation 10 having a wavelength in the EUV range, in particular in the range of 5 nm to 30 nm.

The mirror array 22 is embodied modularly. It is embodied as a tile element in particular in such a way that the parqueting of the total reflection surface of the mirror array 22 can be extended in any desired manner by a tiling of a plurality of tile elements of this type, that is to say of a plurality of identically embodied mirror arrays 22. In this case, the different terms "parqueting" and "tiling" are used merely in order to distinguish between the parqueting of the total reflection surface of an individual mirror array 22 by the mirror elements 23 and that of a multi-mirror array by the plurality of mirror arrays 22. They both designate a gapless and overlap-free covering of a simply connected domain in one plane. Even if the covering of the total reflection surface is not perfectly gapless in the present case, which is reflected in a degree of filling of <1, the term parqueting or tiling is employed hereinafter provided that the degree of filling has the value specified above, in particular at least 0.85.

The mirror elements 23 are held by the substrate 30. The substrate 30 has an edge region 42 extending in a direction perpendicular to the surface normal 41. The edge region 42 is arranged, in particular, circumferentially around the mirror elements 23. It has, in a direction perpendicular to the surface normal 41, a width b, in particular a maximum width b, of at most 5 mm, in particular at most 3 mm, in particular at most 1 mm, in particular at most 0.5 mm, in particular at most 0.3 mm, in particular at most 0.2 mm. The total surface of the mirror array 22 thus projects beyond the total reflection surface, that is to say beyond the outer edge thereof, by at most 5 mm, in particular at most 3 mm, in particular at most 1 mm, in particular at most 0.5 mm, in particular at most 0.3 mm, in particular at most 0.2 mm, in a direction perpendicular to the surface normal 41.

The total surface area of the mirror array 22 is in the range of 1 mm×1 mm to 50 mm×50 mm, in particular in the range of 10 mm×10 mm to 25 mm×25 mm. Other dimensions are likewise possible in principle. It can, in particular, also deviate from the square shape. The overhang of the total surface of the mirror array 22 beyond the total reflection surface thereof is also designated as lateral overhead. The ratio of lateral overhead to total extent in the same direction is at most 0.1, in particular at most 0.05, in particular at most 0.03, in particular at most 0.02, in particular at most 0.01. The lateral overhang is therefore less than the total extent of the total reflection surface of the mirror array 22 by at least one order of magnitude.

The optical component 40 comprises a carrying structure 43 besides the mirror array 22. The carrying structure 43 is arranged in a manner offset, in particular adjacent, with respect to the mirror array 22 in the direction of the surface normal 41. It preferably has a cross section identical to that of the substrate 30 of the mirror array 22. It generally projects beyond the substrate 30 and thus beyond the total surface of the mirror array 22 in a direction perpendicular to the surface normal 41 by at most 5 mm, in particular at most 3 mm, in particular at most 1 mm, in particular at most 0.5 mm, in particular at most 0.1 mm, in particular at most 0.05 mm, in particular not at all. An arrangement of this type is also designated as an arrangement according to the "shadow casting principle". This is understood to mean, in particular, that the carrying structure 43 is arranged completely within a parallel projection of the total surface of the mirror array 22 in the direction of the surface normal 41.

The carrying structure 43 is composed of a ceramic- and/or silicon-containing and/or aluminum-containing material. This enables heat dissipation from the mirror array 22 in conjunction with high mechanical stability. Examples of the material of the carrying structure 43 include ceramic materials, silicon, silicon dioxide, aluminum nitrite and aluminum oxide, for example $Al_2O_3$ ceramic. The carrying structure 43 can be produced, in particular, from a wafer.

The carrying structure 43 can also be produced from quartz or a glass wafer provided with so-called thermal vias.

The carrying structure 43 has a cutout 44 open on one side. The cutout 44 forms a receptacle space open on one side for receiving further functional constituent parts. The cutout 44 is delimited, on the opposite side thereof to the mirror array 22, by a base 45 of the carrying structure in the direction of the surface normal 41. It is delimited laterally, that is to say in a direction perpendicular to the surface normal 41, by an edge region 46 of the carrying structure 43. The edge region 46 has a width $b_C$ in a direction perpendicular to the surface normal 41. In this case, $0.5 \times b \leq b_C \leq 2 \times b$ holds true. The edge region 46 of the carrying structure 43 can, in particular, be just as wide as the edge region 42 of the substrate 30, $b=b_C$.

The carrying structure 43 is mechanically connected to the mirror array 22 exclusively in the edge region 46. A seal element 61 is arranged between the carrying structure 43 and the mirror array 22. The seal element 61 is integrated into a metallization on the rear side 48 of the substrate 30 of the mirror array 22. It can also be embodied as a seal ring arranged on the edge region 46 of the carrying structure 4. Consequently, the receptacle space formed by the cutout 44 is encapsulated, that is to say closed off in a liquid-tight manner, in particular in a gas-tight manner, at least during the production of the component 40. In principle, it is possible to arrange the ASICs 52 in an encapsulated manner, that is to say in a manner closed off in a liquid-tight manner, in particular in a gas-tight manner. This also necessitates a continuous intermediate layer (not illustrated in the figures) between the mirror array 22 and the ASICs 52.

A multiplicity of signal lines 47 are integrated into the carrying structure 43. The signal lines 47 are embodied as electrical plated-through holes, so-called "vias". They are directly bonded to the rear side 48 of the mirror array 22, the rear side being the opposite side to the reflection surfaces 36. They are additionally provided with contact elements 50 on the opposite side to the mirror array 22, that is to say on the rear side 49 of the carrying structure 43. Each component 40 can have more than 30, in particular more than 50, in particular more than 70, signal lines 47. The signal lines 47 serve, inter alia, for the power supply of a driver stage of a displacement device 51 for the displacement of the mirror elements 23. The driver stage is integrated into the carrying structure 43. It is embodied, in particular, as an application specific integrated circuit 52 (ASIC). The component 40 can have a plurality of ASICs 52. It comprises at least one ASIC 52, in particular at least two, in particular at least four, in particular at least nine, in particular at least 16, in particular at least 25, in particular at least 100, ASICs 52. In this case, each of the ASICs 52 is signal-connected to at least one mirror element 23, in particular to a plurality of mirror elements 23, in particular to at least two, in particular at least four, in particular at least eight, mirror elements 23. For details of the control of the actuators for displacing the mirror elements 23, reference should be made to WO 2010/049 076 A2.

The signal lines 47 to the ASICs 52 run from the rear side 49 of the carrying structure 43 through the carrying structure 43 onto the rear side 48 of the mirror array 22, from there along the rear side 48 of the mirror array 22 and via a flip-chip contact 53 onto the ASICs 52. A description of flip-chip technology can be found in the book "Baugruppentechnologie der Elektronik-Montage" ["Technology for Assemblies in Electronic Mounting"] (Editor: Wolfgang Scheel, 2nd edition, Verlag Technik, Berlin, 1999). The signal lines to the integrated or local driver electronics are thus led on the rear side 48 of the mirror arrays 22. A control voltage generated on the ASIC 52 and serving for controlling the displacement of one of the mirror elements 23 is applied via a further flip-chip contact 53 onto the rear side 48 of the mirror array 22 to a corresponding electrode 54. Consequently, all the electrical contact-connections of one of the ASICs 52 are situated on the same side of the ASIC 52. They are situated, in particular, on that side of the ASIC 52 which faces the mirror array 22. Double-sided contact-connection and also through-plating of the ASIC 52, which is likewise possible in principle, are thereby avoided. A further advantage of such an arrangement of the signal lines 47 is that all the signal lines 47 can be laid on the rear side 48 of the mirror array 22 in a single metal layer. This leads to a simplification of the production process and thus to a reduction of the production costs.

Furthermore, the signal lines 47 are embodied and arranged in such a way that specific signal lines 47 are laid together on the front side 43a of the carrying structure 43 facing the mirror array 22 and/or on the rear side 49 of the carrying structure. By way of example, the signal lines 47 for the supply voltages of the ASICs 52 are connected together. This leads to a signal reduction in the region of the carrying structure 43. The signal reduction in the region of the carrying structure 43 is, in particular, at least 10:1.

On the rear side 49 of the carrying structure 43, the component 40 has an electrical interface 55. The interface 55 is arranged, in particular, completely on the rear side 49 of the carrying structure 43, the rear side being the opposite side relative to the mirror array 22. Lateral contacts, which are possible in principle, can be completely dispensed with. The "shadow casting principle" is therefore also complied with during the signal flow (cf. FIG. 25). Consequently, both the component parts of the component 40 and also the signal and heat flow in the latter are oriented in the direction of the surface normal 41. The component 40 therefore has vertical integration.

In the case of the embodiment illustrated in FIG. 7, the electrical interface 55 has a multiplicity of contact pins 56 applied to the rear side 49 of the carrying structure 43. As an alternative thereto, the contact elements 50 of the electrical interface 55 can also be embodied in planar fashion, as illustrated by way of example in FIG. 9.

As an alternative thereto, the contact elements 50 of the electrical interface 55 can also be embodied as integrated pins in the carrying structure 43. In this case, plated-through holes (vias) in the carrying structure 43, which are embodied for example as through holes filled with gold, are partly uncovered in the region of the rear side 49 of the carrying structure 43. This can be achieved, in particular, by etching away part of the material of the carrying structure 43 that surrounds the plated-through holes. The uncovered segment of the plated-through holes then forms the contact element 50.

Furthermore, the carrying structure 43 comprises a ferromagnetic element 57. It comprises in particular at least one ferromagnetic element 57. A plurality of ferromagnetic elements 57 can also be provided. The ferromagnetic element 57 is embodied as a metal plate or as a metal foil. The ferromagnetic element 57 can also be embodied as a permanent magnetic element. According to the embodiments illustrated by way of example in FIGS. 7 and 9, the metal foil 57 is arranged in the cutout 44 of the carrying structure 43. In particular, the metal foil is fixedly connected to the carrying structure 43. It can be bonded onto the carrying structure 43, for example. It can also be adhesively bonded. Direct electrolytic deposition of a ferromagnetic metal layer onto the carrying structure 43 as a ferromagnetic element 57 is likewise possible. The metal foil 57 can, as illustrated by way of example in FIG. 10, also be arranged on the rear side 49 of the carrying structure 43. In principle, a combination of the arrangement of the metal foil 57 in the cutout 44 and on the rear side 49 of the carrying structure 43 is also possible.

The metal foil 57 can be arranged in particular between the ASICs 52 and the base 45 of the carrying structure 43. In this case, the metal foil can also form a thermal interface between the ASICs 52 and the carrying structure 43. In this case, it is advantageous for the metal foil 57 to be embodied as a soft, corrugated metal foil, that is to say as a so-called spring foil.

Moreover, an additional heat-conducting element 78 can be arranged between the ASICs 52 and the base 45 of the carrying structure 43, in particular between the ASICs 52 and the metal foil 57. A plurality of heat-conducting elements 78 can also be provided. The ASICs 52 can, in particular, be embedded at least partly into the heat-conducting element 78 within the cutout 44. Such a thermal interface between the ASICs 52 and the base 45 of the carrying structure 43 improves the vertical integration of the heat flow through the component 40. Heat from the mirror array 22 and in particular from the ASICs 52 can in this case be dissipated directly, that is to say substantially in the direction of the surface normal 41, to the base 45 of the carrying structure 43 and through the latter.

Furthermore, the component 40 has orienting elements 58. The orienting elements 58 can be part of an orienting device, which facilitates firstly the gripping and handling of the component 40 and secondly the arrangement and orientation thereof on a baseplate 59, which will be described in even greater detail below. The orienting elements 58 can be embodied in particular optically, mechanically or electrically. They are arranged in particular in the edge region 42 of the substrate 30 of the mirror array 22. They are therefore arranged on the front side 60 of the component 40. Orienting elements 58 can correspondingly be provided on the rear side 49 of the carrying structure 43. The orienting elements 58 on the rear side 49 of the carrying structure 43 can be embodied, in particular, in such a way that, as a result of interaction with corresponding elements of the baseplate 59, they bring about self-alignment of the components 40 on the baseplate 59. The orienting elements 58 additionally prevent slipping of the components 40 on the baseplate 59. They can therefore bring about and ensure a predetermined arrangement and orientation of the components 40.

Aspects of a further embodiment of the component 40 are described below with reference to FIG. 8. Identical parts are given the same reference signs as in the exemplary embodiments described above, to the description of which reference is hereby made.

FIG. 8 schematically illustrates primarily details of the electrical contacts and signal lines 47 through the component 40a. In this embodiment, the signal lines 47 run through the ASICs 52a. For this purpose, the ASICs 52a are provided with so-called plated-through holes, in particular through-silicon vias (TSV). They have double-sided contact-connection. The signal paths through the component 40a are shortened even further as a result. The risk of a short circuit is reduced as a result. Moreover, the thermal resistance is reduced. This contributes to vertical integration and further reduction of the lateral overhead.

Further aspects of the carrying structure 43 are described below with reference to FIGS. 11 to 14. The signal lines 47 embodied as plated-through holes (through vias) are discernible, in particular, in FIGS. 11 and 13. The signal lines are arranged, in particular, in two rows lying opposite one another. In principle, it is also possible to arrange the signal lines 47 in one row or else more than two, in particular at least three, in particular at least four or more rows. They can, in particular, also be arranged on all four sides of the cutout 44. The signal lines 47 can, for example, also be arranged in double rows, in particular in offset double rows.

In the embodiment illustrated in FIGS. 11 to 14, the ferromagnetic metal foil 57 is applied to the rear side 49 of the carrying structure 43. It has two strip-shaped, in particular rectangular, openings 62 for making contact with the contact elements 50. Contact elements 63 for making contact with the mirror array 22 are additionally highlighted in FIGS. 11 and 12. The contact elements 63 are likewise arranged in two rows lying opposite one another. Alternative arrangements are likewise conceivable. Moreover, connecting lines 64 for signal reduction within the carrying structure 63 are illustrated by way of example. The illustration shows by way of example how a plurality of contact elements 63 can, via connecting lines 64 of this type, be led to the same signal line 47, that is to say electrically connected thereto. The actual number of signal lines 47, in particular of contact elements 63 of the carrying structure 43 can be significantly greater than is illustrated in FIGS. 11 to 14. The number of contact elements 50 on the rear side 49 of the carrying structure 43 is in particular in the range of 10 to 200, in particular in the range of 40 to 150. The number of signal lines 47 through the carrying structure 43 is in particular at least of the same magnitude as the number of contact elements 50 on the rear side 49 of the carrying structure 43. The number of the signal lines 47 through the carrying structure 43 is in particular in the range of 10 to 300, in particular in the range of 30 to 200. It is in particular at least 50, in particular at least 100. The number of contact elements 63 for making contact with the mirror array 22 is in particular at least of the same magnitude as the number of signal lines 47. In principle, it is also possible to connect a plurality of signal lines 47 to an individual contact element 63. In this case, the number of contact elements 63 can also be less than the number of signal lines 47. The number of contact elements 63 is in particular in the range of 10 to 1000. It is in particular at least 50, in particular at least 100.

FIG. 15 illustrates by way of example the contacts on the rear side 48 of the mirror array 22. In this case, the position of four ASICs 52 situated underneath is illustrated by way of example, in a dashed fashion, for elucidation purposes. In this embodiment, the seal ring 61 is integrated into the metalized rear side 48 the substrate 30 of the mirror array 22. For each of the ASICs 52, groups of flip-chip contacts 53 arranged in matrix-like fashion are provided on the rear side 48 of the mirror array 22. Moreover, four signal lines 47 in each case are illustrated by way of example, which serve for the power supply and the supply of the ASICs 52 with input signals, in particular digital input signals. The signal lines 47 are therefore in particular supply voltage leads and/or data lines for controlling the ASICs 52. In this case, a group of signal lines 47 can serve for supplying a plurality of ASICs 52. Signal reduction thus occurs. Flip-chip contacts 53 are likewise provided for connecting the signal lines 47 to the ASICs 52. All the contacts 53 and signal lines 47 can be structured, that is to say integrated, in a single metal layer on the rear side 48 of the mirror array 22. A multilayered embodiment of the metallization on the rear side 48 of the mirror array 22 is likewise possible in principle. For exemplary details of the voltage and signal supply of the ASICs 52 and the control of the actuators of the mirror array 22 via the ASICs 52, reference should be made to WO 2010/049 076 A2.

The component 40 forms a self-contained functional unit.

Details and particulars of an optical assembly 65 are described below with reference to FIGS. 16 to 24. The assembly 65 can serve, for example, as facet mirrors 13, 14 of the illumination optical unit 4 of the projection exposure apparatus 1. In principle, the assembly 65 can also be part of the projection optical unit 7 of the projection exposure apparatus 1. As illustrated highly schematically in FIG. 16, the assembly 65 comprises the baseplate 59 and also a plurality of the optical components 40, 40a described above. The baseplate 59 forms a mechanically supporting element for the optical components 40. It has a size and form which can be chosen freely within the possibilities for the material processing of the material of the baseplate 59, in particular metal processing. Furthermore, the baseplate 59 serves for cooling the optical components 40. The components 40, 40a are arranged on the baseplate 59. They are fixed on the baseplate 59 via a fixing device 66, which will be described in even greater detail below. On account of the modular construction of the components 40, it is possible to arrange in principle any desired number of components 40 on the baseplate 59. The number and arrangement of the components 40 is merely restricted by the dimensions of the baseplate 59. Generally, the number of optical components 40 of the assembly 65 is at least 1, in particular at least 5, in particular at least 16, in particular at least 64, in particular at least 256. The components 40 are arranged in particular on the baseplate 59 in such a way that they parquet a predetermined region on the baseplate 59 substantially without any gaps. The components 40 are arranged in particular in a densely packed fashion on the baseplate 59. Adjacent components 40 are arranged at a distance d from one another on the baseplate 59. The distance d between adjacently arranged components 40 is in particular at most 1 mm, in particular at most 500 µm, in particular at most 300 µm, in particular at most 200 µm, in particular at most 100 µm, in particular at most 50 µm. The distance d between two adjacently arranged components 40 is in particular at most of the same magnitude as the lateral overhead of an individual component 40. On account of the vertical integration of the individual components 40 it is thus possible to produce a substantially arbitrarily shaped, in particular arbitrarily sized, total mirror surface by arrangement of the components 40 on the baseplate 59.

According to one advantageous embodiment, the components 40 are arranged exchangeably, in particular exchangeably in a non-destructive manner, on the baseplate 59. As an alternative thereto, it is possible for the components 40 to be fixedly connected to the baseplate 59. They can be connected to the baseplate 59 for example via an adhesive layer (not illustrated in the figures). In particular the thermal conduction between the components 40 and the baseplate 59 can thereby be improved even further.

The thermal resistance between the components 40 and the baseplate 59 is preferably less than 1 K/W. The baseplate 59 is composed of a material having good thermal conductivity. It is composed, in particular, of metal, for example copper, aluminum or a compound of the elements. It has a polished surface on its front side 67 facing the components 40. This improves the mechanical and/or thermal and/or electrical contact between the components 40 and the baseplate 59. In particular the heat transfer resistance from a component 40 to the baseplate 59 can be reduced a result of the polishing of the surface.

In order to improve the cooling of the assembly 65, in particular of the optical components 40, the assembly 65 has a cooling system 68. The cooling system 68 can comprise one or a plurality of cooling lines 70 to which cooling fluid 69 can be applied. Each cooling line 70 comprises a feed line 71, a cooling section 72 integrated into the baseplate 59, and a discharge line 73. The feed line 71 and the discharge line 73 are both arranged on a rear side 74 of the baseplate 59, the rear side being the opposite side to the optical components 40. In particular a gas or liquid is appropriate as cooling fluid 69.

The cooling system 68 can have one or a plurality of cooling lines 70. The latter can be arranged in a manner distributed over the periphery of the baseplate 59. It is also possible to arrange the cooling lines 70 only in a specific peripheral region of the baseplate 59, in particular only on one side of the baseplate 59. The cooling section 72 can be arranged, as illustrated in FIG. 21, only in an edge region of the baseplate 59. In this case, the cooling section is embodied, in particular, in meandering fashion.

FIG. 22 illustrates an alternative embodiment of the cooling system 68. In this embodiment, the cooling lines 70, in particular the cooling section 72, are arranged in a manner running parallel to the extent of the baseplate 59, that is to say in particular perpendicular to the surface normal 41. The cooling section 72 is integrated into the baseplate 59 in this embodiment as well. Such an arrangement of the cooling lines 70, in particular of the cooling sections 72, makes it possible to reduce, in particular avoid, a lateral temperature gradient in the baseplate 59.

FIG. 23 illustrates a further, alternative or additional embodiment of the cooling system 68. In this embodiment, the cooling lines 70 are arranged in a separate cooling plate 75. The cooling plate 75 is arranged at a distance from the baseplate 59. It is, in particular, mechanically decoupled from the baseplate 59. The cooling plate 75 can be arranged in particular in a manner offset with respect to the baseplate 59 in the direction of the surface normal 41. In order to ensure a sufficient heat flow from the baseplate 59 to the cooling plate 75, a multiplicity of heat-conducting elements 76 are provided. The heat-conducting elements 76 are mechanically soft elements having high thermal conductivity. By way of example, copper cables, copper foils or other mechanically soft elements specialized for thermal conduction are appropriate for them. In one particularly advantageous embodiment, the heat-conducting elements 76 can be made from encapsulated highly oriented graphite (HOPG).

In principle, the mechanical decoupling of the baseplate 59 from the cooling plate 75 can be further improved by additional mechanical damping elements 77, which are arranged between the baseplate 59 and the cooling plate 75. In this embodiment of the cooling system 65, transmission of oscillations excited by the cooling liquid flow to the baseplate, in particular to the components 40 arranged thereon, in particular to the mirror elements 23, can be reduced, in particular avoided to the extent of at least 90%. This improves the positional stability of the mirror elements 23 and hence the optical quality of the mirror array 22 of the component 40 of the assembly 65.

In principle, it is also possible to arrange the cooling plate 75 differently, for example in a manner laterally offset with respect to the baseplate 59. Moreover, the cooling plate 75 can have leadthrough openings (not illustrated in FIG. 23) for leading through electrical signal lines to the baseplate 59.

The cooling system 68 can thus be linked to the baseplate 59 directly or indirectly. It can, in particular, be embodied in a manner integrated into the baseplate or separately from the latter and connected to the latter via the heat-conducting elements 76.

The fixing device 66 is described in greater detail below. The fixing device 66 comprises at least one, in particular a plurality of, magnetic means. It is therefore also designated as a magnetic fixing device 66. It comprises in particular an arrangement of a plurality of permanent magnets 79. The permanent magnets 79 are arranged in such a way that their north pole and south pole are respectively arranged alongside one another in the direction of the surface normal 41. For each component 40 to be arranged on the baseplate 59, two permanent magnets 79 having mutually opposite polarities are arranged in a manner lying alongside one another in a direction perpendicular to the surface normal 41. A different number of permanent magnets 79 per component 40 is likewise possible. It is possible, in particular, to provide one, four or eight permanent magnets 79 per component 40. The arrangement of the permanent magnets 79 is chosen in such a way that the holding force exerted by the latter on the component 40 is optimized.

The fixing device 66, in particular the permanent magnets 79, are integrated into the baseplate 59.

The fixing device 66 furthermore comprises a ferromagnetic element 80. The additional ferromagnetic element 80 is likewise integrated into the baseplate 59. It serves for amplifying the magnetic flux generated by the permanent magnets 79.

Via the fixing device 66, a magnetic holding force can be exerted on the optical component 40, in particular on the ferromagnetic element 57 thereof. The holding force respectively exerted by the permanent magnets 79 of the fixing device 66 on the component 40 is in particular at least 10 N. It can be regulable. This can be achieved, for example, by regulating the distance between the permanent magnets 79 of the fixing device 66 and the ferromagnetic element 57 of the component 40.

The distance between the permanent magnets 79 and the ferromagnetic element 57 is in the range up to 1 cm, in particular in the range of 100 µm to 1 mm.

The permanent magnets 79 can advantageously be arranged in the baseplate 59 in such a way that self-aligning orientation of the component 40 on the baseplate 59 occurs upon interaction with the ferromagnetic element 57 of the component 40.

In one advantageous embodiment (cf. FIG. 37), the fixing device 66 can have additional electromagnets 81. In this case the electromagnets 81 are preferably arranged on the opposite side of the permanent magnets 79 to the components 40, in particular on the rear side 47 of the baseplate 59. The electromagnets 81 can be arranged, in particular, in a releasable manner on the rear side 74 of the baseplate 59. An additional, temporary magnetic field can be generated via the electromagnets. In particular a temporary compensation of the holding force exerted by the permanent magnets 79 on an optical component 40 is thereby possible. Via the electromagnets 81 it is thus possible to embody the fixing device 66 in such a way that the mechanical connection between the baseplate 59 and one of the optical components 40 in particular during a mounting/demounting process forms a so-called zero insertion force interface (ZIF).

Moreover, the baseplate 59 comprises means for producing an electrical contact with the interface 55 of the optical components 40. These are embodied as contact pins 82. The contact pins 82 are integrated in cutouts 83 in the baseplate 59. The contact pins 82 are arranged in rows. They are arranged, in particular, on respectively two mutually opposite sides of the permanent magnets 79 of the fixing device 66 (cf. FIG. 18). They are arranged, in particular in double rows between the permanent magnets 79 which serve for fixing adjacent components 40. The arrangement of the contact pins 82 corresponds, in particular, precisely to the arrangement of the contact elements 50 of the interface 55 on the rear side 49 of the optical components 40. They are arranged in such a way that a respective contact pin 82, upon the arrangement of a component 40 on the baseplate 59, forms an electrical contact with a contact element 50 of the interface 55 of the component. A contact resistance between a contact pin 82 and a contact element 50 is in each case in particular at most 100 mΩ. In one advantageous embodiment, a grid of channels 89 open on both sides is arranged in the baseplate 59. The channels 89 extend from the front side 67 of the baseplate 59 as far as the rear side 74 thereof. They are arranged in particular in each case between two permanent magnets 79 of the fixing device 66. They are therefore arranged in such a way that they are arranged in each case centrally with respect to an optical component 40. Compressed air can be applied to the channels 89 in order to facilitate the demounting of a component 40.

In order to facilitate the formation of an electrical contact between a contact pin 82 and the associated contact element 50 of the interface 55 of the component 40, the contact pin 82 is in each case sprung, that is to say embodied as a spring contact pin, spring pin for short. It can be embodied, in particular, as sprung on both sides. The contact pins 82 can, in a manner combined in groups, in particular be cast into an electrically insulating substrate 84, for example composed of ceramic, glass or Teflon. The substrate 84 can be incorporated as a whole into the baseplate 59. An embodiment of this type enables a particularly simple arrangement of the contact pins 82 in the baseplate 59 and thus facilitates the method for producing the same.

On the rear side 74 of the baseplate 59, the contact pins 82 are in each case in electrical contact with a circuit board 85. The circuit board 85 is composed, in particular, of a ceramic or metallic material. The circuit board 85 can be, in particular, a printed circuit board (PCB). It serves for taking up and conducting the signals for controlling the individual mirrors 23 via the ASICs 52. In particular calibration data of individual optical components 40 can be stored in an additional microchip/ASIC applied to the circuit boards 85. The assembly 65 comprises, in particular, a multiplicity of circuit boards 85. The latter are embodiment in strip-shaped fashion. They are arranged, in particular, in a manner corresponding to the arrangement of the contact elements 50 of the interface 55 in parallel strips on the rear side 74 of the baseplate 59. It is possible to provide one circuit board 85 in each case for a double row of the contact pins 82. The circuit boards 85 are fixedly connected to the baseplate 59. They can be releasably connected to the baseplate 59. They are, in particular, screwed to the baseplate 59. In each case a plurality of connecting screws 86 per circuit board 85 serve for this purpose. When the circuit boards 85 are screwed to the baseplate 59, contact areas 87 on the circuit board 85 come into electrical contact with the contact pins 82. In an alternative embodiment, the contact pins 82 are directly connected, in particular soldered or welded, to the circuit board 85. In this case, they are introduced into the cutouts 83 in the baseplate 59 and thus integrated into the baseplate 59 upon the screwing of the circuit board 85.

The contact pins 82 can additionally serve as an optical and/or mechanical aid for orienting the components 40 on the baseplate 59. Additional optical and/or mechanical aids 88 of this type can also be arranged on the front side 67 of the baseplate 59. Aids 88 of this type are indicated schematically in a greatly simplified manner in FIG. 16. The aids 88 make it possible, in particular, for the baseplate 59 to be equipped with components 40 in an automated fashion. This facilitates the production of the assembly 65. The mechanical aids 88 are preferably embodied in such a way that they lead to a passive self-alignment of the optical components 40 on the baseplate 59.

A method for producing the optical component 40 is described below with reference to FIG. 35. In order to elucidate the method, intermediate products obtained in this case are illustrated schematically in FIGS. 26 to 34. Firstly, a mirror array 22 is preprocessed in a preliminary process 123. The preliminary process can comprise a providing step, a polishing step and a coating step. For details of these preprocessing steps, reference should be made to WO 2010/049 076 A2, in particular FIG. 17 and associated description.

In a joining step 90, a mirror array wafer stack 91 with the preprocessed mirror array 22 and a carrier substrate 92 is produced. The carrier substrate 92 is also designated as "mirror handle wafer". It firstly serves for protecting the mirror elements 23 of the mirror array 22; it secondly contributes decisively to the mechanical stability of the mirror array wafer stack 91. The carrier substrate 92 can be connected to one or, in particular, to a plurality of preprocessed mirror arrays 22. The carrier substrate 92 can also already be part of the preprocessed mirror array 22. In particular, the carrier substrate 92 can already be part of the method for producing micromirrors having extremely smooth surfaces that is described in WO 2010/049 076 A2.

In a linking step 93, the ASICs 52 are then bonded onto the rear side 48 of the mirror array 22. This can be done in a flip-chip method. The intermediate product produced in this way is illustrated schematically in FIG. 27.

A providing step 94 involves providing a substrate 95 for producing the carrying structure 43. The substrate 95 is a wafer, in particular a silicon wafer, in particular a so-called through-silicon via (TSV) wafer. The latter already has, in particular, plated-through holes 96 for the signal lines 47. The substrate may also already have been provided with contact elements 50.

An applying step 97 involves applying the ferromagnetic metal foil 57 to the TSV wafer 95. In this case, the metal foil 57 is already prestructured. It already has, in particular, the openings 62 for access to the interface 55, in particular to the contact elements 50. If appropriate, a separate structuring step is provided for this purpose. The metal foil 57 is bonded, in particular, onto the rear side 49 of the TSV wafer 95. As an alternative thereto, electrolytic deposition of a ferromagnetic metal layer onto the rear side 49 of the TSV wafer 95 is possible.

In an etching step 98, the TSV wafer 95 is provided with the cutout 44. In the case of the intermediate product illustrated in FIG. 30, the cutout 44 is arranged on the opposite side of the TSV wafer 95 to the metal foil 57.

By way of example, a silicon deep etching method is provided for the etching step 98. In principle, the cutout 44 can also be introduced into the TSV wafer 95 in some other way, for example via a mechanical method.

In order to produce a plurality of components 40 in parallel, a plurality of cutouts 44 can be introduced into the TSV wafer 95. The cutouts 44 can be introduced into the TSV wafer 95 in particular simultaneously, in a single method step.

As described above, various embodiments with different arrangements of the metal foil 57 are possible. In the case of an arrangement of the metal foil 57 in the cutout 44, the etching step 98 is, of course, provided before the applying step 97.

The applying step 97 and the etching step 98 together form a pretreatment step 105 of the TSV wafer 95. The latter later forms the carrying structure 43.

In a connecting step 99, the TSV wafer 95 provided with the cutout 44 is connected to the mirror array wafer stack 91. The TSV wafer 95 is bonded, in particular, onto the rear side of the mirror array wafer stack 91. This results in the formation of electrical contacts between the plated-through holes 96 in the TSV wafer 95 and corresponding, associated flip-chip contacts 53 on the rear side 48 of the substrate 30 of the mirror array 22.

In a sawing step 100, the wafer 95 and the mirror array wafer stack 91 are sawn in the direction of the surface normal 41. In this case, the sawing cuts are arranged in a manner corresponding to the external dimensions of the component 40. During the sawing step 100, the TSV wafer 95 and the substrate 30 of the mirror array 22 are completely severed. The cutting depth of the sawing step 100 is chosen such that the carrier substrate 93, which forms the topmost layer of the mirror array wafer stack 91, is at most partly severed, in particular remains intact. After the sawing step 100, the later components 40 are thus exclusively held together by the carrier substrate 92.

In a subsequent singulation step 101, the carrier substrate 92 is removed for the purpose of singulating the components 40. An etching method is preferably provided for this purpose. After the removal of the carrier substrate 92, a protective layer 102 is still situated on the mirror array 22. The protective layer 102 is composed of silicon oxide, for example.

In a further etching step 103, the protective layer 102 is removed. In particular, etching via gaseous hydrofluoric acid is provided for this purpose. The etching step 103 can be effected, in particular, in a non-oxidizing atmosphere in order to prevent reoxidation of the reflection surfaces 36 of the mirror elements 23. Until the removal of the protective layer 102, the mirror elements 23 are protected by the latter. The mirror elements 23 are thus protected by the protective layer 102 and the carrier substrate 92 in particular during the linking step 93. The linking of the ASICs 52 and the connection of the TSV wafer 95 to the mirror array wafer stack 91 are effected, in particular, before the singulation step 101.

A coating step 104 can then be provided in order to provide the mirror elements 23, in particular the reflection surfaces 36 thereof, with a coating. The coating can be, in particular, an EUV-reflective coating. A multilayer coating can be involved, in particular.

One essential advantage of the above-described method for producing the component 40 is that the latter can be effected continuously in a batch process, that is to say at the wafer level. Process steps which are to be carried out at the chip level can be avoided. The method is significantly simplified as a result. The costs for the production of the component 40 can thereby be reduced.

A tool 106 for handling, in particular for displacing, the optical component 40 is described below with reference to FIG. 36. The tool 106 comprises a base body 107. The base body 107 has dimensions adapted to the dimensions of the optical component 40. A plurality of electromagnets 108, 109 are arranged in the base body 107, two of which electromagnets are respectively illustrated by way of example in FIG. 36. Generally, the tool 106 comprises at least one electromagnet 108. The electromagnets 108 can be driven individually. For this purpose, the tool 106 has a control device 110. The electromagnets 109 can also be driven individually via the control device 110. A magnetic holding force for holding the component 40 can be generated via the electromagnets 108. The holding force can be controlled flexibly via the control device 110. The electromagnets 109 serve to compensate for the holding force exerted on the component 40 by the fixing device 66 in the baseplate 59. The holding force is dependent, in particular, on the distance between the component 40 and the baseplate 59. Through the control of the magnetic fields generated by the electromagnets 109 via the control device 110, the compensation of the force exerted by the fixing device 66 on the component 40 can be effected very precisely.

In principle, it suffices if the component 40 can be held by the tool 106 with a predetermined holding force. For this purpose, it is merely necessary for the magnetic field generated by the electromagnets 108 to be suitably controlled. The magnets 109 can be obviated, in principle.

For measuring the holding force exerted on the component 40, in particular the application pressure between the component 40 and the tool 106, the tool 106 has an array of pressure-sensitive sensors 111. The pressure-sensitive sensors 111 are signal-connected to the control device 110. They are arranged, in particular, respectively between a spacer element 112 and the base body 107. The spacer element 112 is embodied according to the edge region 42 of the substrate 30 of the mirror array 22. It has, in particular. a width $b_S$ that is less than the width b of the edge region 42. Via the spacer element 112, it can be ensured that contact between the optical component 40 and the tool 106 takes place exclusively in the edge region 42 and not in the region of the mirror elements 23.

In principle, the pressure-sensitive sensors 111 can be integrated into the spacer element 112.

Optical, in particular transmissive, structures 113 are introduced in the spacer element 112, the structures enabling the tool 106 to be accurately oriented with respect to the optical component 40. For monitoring and/or controlling the orientation of the tool 106 with respect to the component 40, an optical sensor 114, for example a mini camera, is additionally provided. The optical sensor 114 can be integrated into the base body 107. The optical sensor 114 can be adapted to the orienting elements 58 in particular for interaction with the latter.

Furthermore, provision is made of a central distance sensor 115 for measuring the distance between the tool 106 and the optical component 40. The distance sensor 115 is arranged in particular centrally, that is to say in the middle, on the front side 116 of the base body 107 facing the component 40. In principle, a plurality of, in particular at least four, distance sensors 115 can also be provided. The distance sensor 115 is signal-connected to the control device 110.

Furthermore, distance sensors 117 are provided in order to measure the distance and/or the orientation of the tool 106, in particular of the optical component 40 held by the latter, with respect to the baseplate 59. The distance sensors 117 are signal-connected to the control device 110. The tool 106 preferably has at least three, in particular at least four, distance sensors 117.

Moreover, one or a plurality of optical references 118 can be provided laterally on the base body 107 in order to monitor and/or control the orientation of the tool 106 or of the component 40 held by the tool 106, relative to the baseplate 59.

For particularly advantageous handling of the optical components 40, the base body 107 with the functional constituent parts described above is connected to a placement system, in particular a pick-and-place robot 119. With the aid of the tool 106, it is possible for the baseplate 59 to be equipped with optical components 40 in an automated manner, in particular fully automatically.

Aspects of a method for producing the optical assembly 65 are described below with reference to FIGS. 37 and 38. A providing step 120 involves providing the baseplate 59 with the fixing device 66. In principle, it is possible, for arranging a component 40 on the baseplate 59, to compensate for, in particular neutralize, the magnetic field generated by the permanent magnets 79 of the fixing device 66 via one or a plurality of electromagnets 81 arranged on the rear side 74 of the baseplate 59. Partial compensation of the magnetic field generated by the permanent magnets 79 via the magnets 81 is also possible. In this case, the electromagnets 81 can be provided as part of the assembly 65, in particular of the baseplate 59, and be fixedly or releasably connected to the baseplate 59. As an alternative thereto, the electromagnets 81 can also be part of a separate auxiliary tool. In principle, permanent magnets can also be provided instead of the electromagnets 81.

The at least partial compensation of the magnetic field generated by the magnets 79 via the magnets 81 is designated as an optional compensation step 121.

In one or a plurality of placement steps 122, the components 40 are arranged on the baseplate 59. This is done, in particular, with the aid of the tool 106. According to the invention, provision is made, for the purpose of arranging the components 40 on the baseplate 59, for the magnetic force exerted by the permanent magnets 79 of the fixing device 66 on the component 40 that is respectively to be arranged to be compensated for via an additional magnetic field. The additional magnetic field can be effected via the magnets 81 and/or via the electromagnets 108 for holding the component 40 on the tool 106 and/or in particular via the electromagnets 109. The compensation is effected, in particular, in such a way that exclusively the force acting on the component 40 to be arranged is compensated for, while components 40 already arranged on the baseplate 59, if appropriate, are not influenced thereby. This is possible as a result of a suitable arrangement and/or driving of the magnets 81 and/or 108 and/or in particular 109. As a result of the compensation of the holding force exerted on the component 40 by the permanent magnets 79, the baseplate 59 forms a zero insertion force interface (ZIF) for the component 40 to be arranged. This enables particularly soft, gentle, in particular vibration-free, arrangement of the components 40 on the baseplate 59. In particular, the components 40 are prevented from being able to snap away abruptly upon approaching the baseplate 59.

For the purpose of handling, in particular for the purpose of arrangement on the baseplate 59, or for the purpose of removal from the latter, the components 40 are touched by the tool 106 exclusively in the edge region 42 of the substrate 30 of the mirror array 22. In particular, lateral contact can be dispensed with. In this case, the holding force exerted on the component 40 by the tool 106, in particular the application pressure, is measured with the aid of the sensors 111. The holding force can be controlled, in particular controlled automatically, in particular via the control device 110.

The approach of the component 40 to the baseplate 59, in particular the orientation thereof parallel to one another, is monitored via the distance sensors 117.

The orientation of the component 40 relative to the baseplate 59 is monitored via a the optical references 118.

The pressure-sensitive sensors 111 and/or the distance sensors 117 indicate if the component 40 is in contact with the baseplate 59.

Provided that the component 40 has reached its predetermined position on the baseplate 59, the compensation of the holding force that can be exerted on the component 40 by the permanent magnets 79 can be reduced to zero. The compensation is reduced preferably gradually, in particular continuously.

For demounting a component 40, the holding force exerted on the component 40 by the permanent magnets 79 can in turn be compensated for via the magnets 81 and/or in particular via the electromagnets 108, 109 of the tool 106. The demounting of a component 40 can additionally be supported by applying compressed air to the corresponding channel 89.

Further details of the displacement, i.e. positioning, of the mirror elements 23 of the mirror array 22 are described below. The actuator pin 38 together with the electrodes 54 forms an actuator 131 for displacing the respective mirror element 23.

As illustrated schematically in FIG. 39, the invention provides two different positioning systems 132, 133 for positioning the mirror elements 23 of the mirror array 22, a global positioning system 132 for predefining absolute position data for the positioning of each of the mirror elements 23 and a local positioning system 133 for suppressing momentary disturbances of the positioning of the mirror elements 23, in particular for damping high-frequency oscillations thereof.

The global positioning system 132 comprises a global control/regulating device 134. The absolute positioning of the individual mirror elements 23 can be predefined with the aid of the global control/regulating device 134. The global control/regulating device 134 can be arranged externally with respect to the optical component 40, 40a. The global positioning system 132 furthermore preferably comprises a global sensor device 135 for monitoring the absolute positioning of the mirror elements 23. The global sensor device 135 can have a camera system for phase-measuring deflectometry. For details thereof, reference should be made to WO 2010/094658 A1.

The global control/regulating device 134 can have a lookup table for determining correction values for the displacement of the mirror elements 23. For details of a method for displacing the mirror elements 23, in particular for controlling the displacement of the mirror elements 23, reference should be made to US 2011/0188017 A1, in particular paragraph [0067] to paragraph [0111].

As illustrated schematically in FIG. 40, the actuators 131 are connected to the global control/regulating device 134 in a signal-transmitting manner via the signal lines 47 in the component 40, 40a. The component 40, 40a comprises the interface 55, in particular, for connection to the global control/regulation device 134.

On account of the separation of the global positioning system 132 from the local positioning system 133, it is possible and sufficient to embody the global positioning system 132, in particular the global control/regulating device 134 and/or the global sensor device 135, with a low bandwidth, in particular a bandwidth of at most 20 Hz, in particular of at most 10 Hz. In principle, the global positioning system 132 can also be embodied as a pure actuating element. In this case, provision is made for subjecting the global positioning system 132 to regular recalibration.

The local positioning system 133 comprises a multiplicity of local regulating devices 136 for regulating the positioning of the mirror elements 23. The local regulating devices 136 are in each case completely integrated into the component 40, 40a. In particular, each of the mirror elements 23 is assigned respectively one of the regulating devices 136. The regulating devices 136 are arranged, in particular, in each case completely within a volume defined by parallel projection of the associated mirror element 23. They each have at least one, in particular, two, three or more electronic circuits 137. The regulating device 136 comprises in particular at least one, in particular at least two, in particular at least three, in particular at least four, control loops. The control loops each comprise at least one actuator, a sensor and a controller. They are in each case connected to the mirror element 23 to be regulated. One possible embodiment of one of the circuits 137 of one of the control loops is illustrated by way of example in FIG. 46. It comprises three, in particular series-connected, operational amplifiers 138, 139, 140. The operational amplifier 140 is connected on the output side to inputs of a differential amplifier 147. The differential amplifier 147 adds an actuating signal 148 and a feedback signal 149 amplified via the operational amplifiers 138, 139, 140. On the output side, the differential amplifier 147 is connected to an output driver stage 150. The output driver stage 150 is, in particular, a high-voltage output driver stage. The latter is connected to at least one of the electrodes 54 via signal lines 47.

The electronic circuits 137 are arranged in the carrying structure 43. They are embodied, in particular, on the ASIC 52.

The local regulating devices 136 are in each active damping devices for actively damping oscillations. In this case, in particular, the speed of the displacement of the mirror element 23 serves as a feedback signal. The speed is read out via a sensor which is integrated in the component 40 and will be described in greater detail below, in particular a speed sensor 151. In principle, a position sensor can also be provided as the sensor. A speed signal can be derived from its data in a simple manner.

The damping devices can have a lower limiting frequency of at least 1 Hz, in particular at least 10 Hz, in particular at least 100 Hz. They preferably have a bandwidth of at least 500 Hz, in particular at least 1 kHz, in particular at least 2 kHz, in particular at least 5 kHz, in particular at least 10 kHz. In this case, the bandwidth of the damping device should be understood to mean the frequency range in which the device is active.

Generally, the damping devices for damping and positioning the mirror elements 23 are designed in such a way that the entire frequency range in which excitations and/or disturbances are to be expected is covered by them. If it can be ruled out that disturbances occur in a specific frequency range, damping of oscillations in this frequency range can be dispensed with, in principle.

The frequency range or the bandwidth of the global positioning system 132 or the constituent parts 134, 135 thereof and of the local positioning system 133 or the constituent parts 136 thereof are illustrated by way of example together with the frequency ranges of typical disturbances of the mirror elements 23 in FIG. 41. The typical disturbances comprise low-frequency effects, in particular changes 152, which occur over the lifetime of the optical component 40, effects 153 which occur on account of electrostatic charging of the mirror elements 23, and thermal elements 154. They additionally comprise resonance peaks 155 of the natural oscillations of the mirror elements 23 which are excited can occur in particular on account of so-called base point excitations, for example on account of the effects 156 of cooling, in particular water cooling.

The invention provides for the global positioning system 132 and the local positioning system 133 to have bandwidths whose ratio is at most 1:10, in particular at most 1:20, in particular at most 1:50. By reducing the bandwidth of the global positioning system 132, the complexity thereof, in particular the associated data flow, can be considerably reduced.

The global positioning system 132, in particular the global control/regulating device 134, together with the components 40 signal-connected thereto, forms a mirror system 157. The mirror system 157 comprises at least one of the components 40, 40a.

For the positioning of the mirror elements 23 of the mirror array 22, absolute position data for the positioning of each of the mirror elements 23 are predefined via the global control/regulating device 134. Disturbances in the positioning of the mirror elements 23 are damped via the local regulating devices 136. The measurement of the absolute position of the mirror elements 23 with a high bandwidth can be avoided in this way. The local positioning system 133 operates with a high bandwidth, but does not have to detect the absolute position of the mirror elements 23. By contrast, the absolute position of the mirror elements is detected via the global positioning system 132, but only with a low bandwidth. Overall, the data rate for positioning the mirror elements or for evaluating the same can thereby be considerably reduced.

While the local positioning system 133 can be completely integrated into the component 40, 40a, the global positioning system 132 can be embodied separately therefrom and can be connected thereto in a signal-transmitting manner via the interface 55.

The construction of the local positioning system 133, in particular of the local regulating device 136 with the speed sensor 151, is described in greater detail below. Each of the regulating devices 136 comprises at least one, in particular at least two, in particular at least three, in particular at least four, control loops with in each case at least one of the speed sensors 151. The latter are embodied as capacitive sensors each having at least one moveable electrode and at least one electrode 158 arranged rigidly relative to the carrying structure 43. In particular, three speed sensors 151 can be provided for each mirror element 23. The speed sensor 151 has, in particular for each degree of freedom of displacement of the associated mirror element 23, in each case at least one electrode 158 arranged rigidly relative to the carrying structure 43. It preferably has in each case at least two rigid electrodes 158 per degree of freedom of displacement. These are interconnected differentially, in particular. It is particularly advantageous if the electrodes 158 of the speed sensor 151 are arranged in a manner corresponding to the electrodes 54 of the actuators. In this case, it is once again possible to provide one rigidly arranged electrode 158 per actuating electrode 54, advantageously two electrodes 158 per actuating electrode 54. A differential interconnection is once again advantageous. A dedicated assignment of the sensors 151 to the corresponding actuators is advantageous. The actuator pin 38, in particular, serves as a moveable electrode. Generally, the moveable electrode of the speed sensor 151 associated with a specific mirror element 23 is mechanically rigidly connected to the mirror element 23. The actuator pin 38 is insulated, i.e. electrically decoupled from the associated mirror element 23, in particular. This can be achieved, for example, via a corresponding embodiment of the spacer 37 and/or of the inner holding body 35. Moreover, it is possible to arrange specific insulating elements 161 between the mirror element 23 and the actuator pin 38. In an alternative embodiment that is particularly simple to produce, the insulation of the actuator pin 38 from the associated mirror element 23 can be dispensed with.

In the case of the actuator pin 38 as a moveable electrode, the latter is configured in a cylindrical fashion. The actuator pin 38 has a circular cross section, in particular. In principle, other cross-sectional forms of the actuator pin 38 are also possible. The actuator pin can have for example an elliptical or a polygonal, in particular rectangular, preferably square, cross section. A triangular or cross-shaped cross section can also be advantageous. In this case, the outer surface of the cylinder or one or more partial regions thereof serve(s) as counterelectrode or counterelectrodes for actuating the mirror element 23. In this case, the moveable electrode is also designated as a central electrode. For details thereof and details concerning the actuation of the mirror element 23 via the actuator pin 38 and the electrodes 54, reference should be made to WO 2010/049076 A2.

The rigid electrodes 158 are also designated as measurement electrodes. They are embodied in a planar fashion. They are integrated in particular into a metal layer 159, in particular into the topmost metal layer 159, of the ASIC 52. They are arranged in each case in extension of the actuator pin 38 in a manner spaced apart from the latter.

The speed sensor 151 measures the capacitance between a base surface 160 of the moveable electrode, i.e. of the actuator pin 38 and the rigid measurement electrode or electrodes 158.

The basic functioning of the speed sensor 151 is described below with reference to FIGS. 43a to 45b. In this case, FIGS. 43a and b illustrate a position of the mirror element 23 which is designated hereinafter as the starting position and in which this is not tilted. In this position, the mirror body 32 and, in the case of a reflection surface 36 embodied as flat, the reflection surface 36 runs parallel to the orientation of the ASIC 52 and the carrying structure 43. In this position, the mirror element 23 is oriented, in particular, in such a way that the mirror body 32 and, in particular its reflection surface 36 run perpendicularly to the surface normal 41 of the mirror array 22. Given a length 1 of the actuator pin 38 measured from the position of a tilting axis 162 with respect to the base surface 160 and a tilting of mirror element 23 about the tilting axis 162 by an angle±α, there is a change in the position of the moveable electrode, i.e. of the actuator pin 38, with respect to the rigid electrodes 158 on the ASIC 52. A tilting of the mirror element 23 by an angle±α results, in particular to a first approximation, in a lateral shifting of the base surface 160 by an absolute value of ±1α relative to the rigid measurement electrodes 158. This results in a change in the effective overlapping area between the base surface 160, i.e. the moveable electrode, and the rigid electrodes 158. This is illustrated by way of example in FIGS. 43b, 44b and 45b. Such a change in the overlap can be measured as a change in the capacitance. Consequently, a lateral shifting of the moveable electrode 38 relative to the rigid electrodes 158 is measured to a first approximation. It goes without saying that a tilting of the mirror element 23 also leads to a change in the distance between the actuator pin 38 and the measurement electrodes 158. This also leads to a change in the capacitance and, consequently, has an influence on the signal that can be measured by the sensor 151. According to the invention, it has been recognized that this can be utilized to the effect that the characteristic of the sensor 151 can be predefined by the design of the rigid electrodes 158 in a simple manner.

The characteristic of the sensor 151 can also be influenced by a targeted design of the base surface 160 of the actuator pin 38, the base surface serving as a moveable electrode. The base surface 160 of the actuator pin 38 can be embodied in a cross-shaped fashion, for example, wherein each of the limbs is oriented precisely according to a tilting direction, in particular a degree of freedom of displacement of the mirror element 23.

The invention provides for the at least one rigidly arranged electrode 158 in each case to have a predefined form embodied in such a way that the sensor 151 has a predefined characteristic. The characteristic of the sensor 151 can be linearized, in particular, via a targeted design of the rigid electrodes 158 that is to say that the speed sensor 151 can have a linear characteristic. As an alternative thereto, it can be advantageous to adapt the characteristic of the sensor 151 to the characteristic of the actuator 131 for displacing the respective mirror element 23. This is advantageous particularly when the actuator characteristic is dependent on the tilting angle α of the mirror element 23. An embodiment of the rigid electrodes 158 in such a way that the characteristic of the sensor 151 is proportional to the characteristic of the actuator 131 makes it possible to considerably reduce the required complexity in the feedback electronics, in particular in the circuit 137.

In the case of two or more rigid electrodes 158 per tilting direction of the mirror element 23, preferably all of the rigid electrodes 158 are embodied in a corresponding fashion.

By virtue of the embodiment of the rigid electrodes 158 in the topmost metal layer 159 of the ASIC 52 the form thereof can be fashioned very flexibly. During the production of the component 40, 40*a* a lithographic step, in particular, is provided for fashioning the rigid electrodes 158. The rigid electrodes 158 can be produced during the production of the ASIC 52 or during the post-processing thereof. Consequently, preferably no additional process steps are required for producing the rigid electrodes 158. In terms of method engineering, too, the speed sensor 151 is therefore an integrated sensor, that is to say that the method steps for producing the latter can be completely integrated into the method steps for producing the ASIC 52.

The arrangement of the rigid electrodes 158 in the topmost metal layer 159 of the ASIC 52 prevents parasitic capacitances such as can occur, for example, in the case of plated-through holes in the substrate 30. Moreover, signal paths are thereby minimized and the coupling in of interference signals is thus reduced. This leads to in particularly high resolution and control quality.

Via additional boot strap electrodes (not illustrated in the figures) situated below the rigid electrodes 158, via a suitable interconnection thereof with the rigid electrodes 158, the influence of parasitic capacitances that are still always present can be minimized further.

Aspects of the measurement carried out via the sensor 151 are described below. As already explained, a tilting of the mirror element 23 about the tilting axis 162 leads to a shifting of the moveable electrode relative to the rigid electrodes 158. To a first approximation, the capacitance $C_{Sens}$ between the base surface 160 of the moveable electrode and the rigid electrodes 158 is proportional to the overlapping area A. This is illustrated by way of example in FIGS. 43*b*, 44*b* and 45*b* for the rigid electrode 158 on the left in each case. The rigid electrodes 158 are embodied and arranged in such a way that the resulting overlapping area A is a predefined function of the position of the base surface 160 of the moveable electrode and thus a function of the deflection/tilting angle α thereof relative to the respective tilting axis 162. The form of the rigid electrodes 158 can be configured, in particular, in each case in such a way that the change in the overlapping area A is proportional to the change in the tilting angle α. Consequently, the measurable capacitance $C_{Sens}$ is proportional to the tilting angle α of the mirror element 23.

Preferably, the rigid electrodes 158 are in this case embodied in such a way that they each react specifically to displacements of the mirror element 23 with respect to a tilting direction, in particular a single degree of freedom of displacement, and are as insensitive as possible with regard to displacements in other tilting directions. They are arranged, in particular, in a manner corresponding to the electrodes 54 for actuating the tilting of the mirror elements. Such avoidance of a cross-coupling between the electrodes 158 for different degrees of freedom of displacement further simplifies the feedback and regulating electronics. In other words, each of the electrodes 158 of the sensor 151 is assigned to a specific activating direction, in particular to a specific degree of freedom of displacement. It has a minimal sensitivity with respect to the other displacement directions. In the case of at least two rigid electrodes 158 per displacement direction, this can be improved further via a differential interconnection of the rigid electrodes 158. A differential interconnection of the rigid electrodes 158 makes it possible to eliminate effects which are not directly associated with a tilting of the mirror element 23, for example effects on the capacitance measurement on account of lifting movements of the mirror element 23.

The way in which the rigid electrodes 158 associated with a specific displacement direction of the mirror element 23 are interconnected with the electrodes 54 of the corresponding actuator 131 is flexible. It is possible, in particular, to interconnect the electrodes 158 of the sensor 151 with the electrodes 54 of the actuator 131 on the same sides. They can also be interconnected in a mirror-inverted manner, which merely necessitates a change of sign in the feedback loop.

It has furthermore been recognized that an active damping of the mirror elements 23, in particular the suppression of excited oscillations, requires only the speed thereof, i.e. the time derivative of the tilting angle α of the mirror elements 23 for the controller input. A detection of the absolute capacitance value is not necessary. This reduces, in particular, the required complexity of the sensor 151. This leads to a significantly reduced space requirement.

The invention provides for keeping the moveable electrode at a constant voltage $U_{bias}$. A tilting of the mirror element 23 about the tilting axis 162 thus leads to a charge transfer $$dQ/dt = U_{bias} \cdot dc_{Sens}/dt$$

from/to the rigid electrodes 158, which can be measured, in principle, after interposition of a resistance $R_{Sens}$, as measurement voltage $$U_{Sens} = R_{Sens} \cdot (U_{bias} \cdot dc_{Sens}/dt)$$

The corresponding basic circuit diagram is illustrated in FIG. 47. In this case, the measurement voltage $U_{Sens}$ is preferably proportional to the time derivative of the tilting angle α of the mirror element 23, i.e. proportional to the speed (angular velocity) of the mirror element 23. This measurement signal, if appropriate after amplification, can be fed back directly to the voltage-controlled actuator 131.

The actual implementation of the sensor 151 and of the actuator 131, that is to say the feedback, is preferably effected via a control loop with operational amplifier as illustrated by way of example in FIG. 46. In this case, the current dQ/dt is amplified via operational amplifier circuits and converted into a voltage signal $U_{Sens}$. The voltage signal then serves as an input signal for the controlled system and is fed back to the corresponding actuating electrode 54 of the actuator 131. An alternative embodiment of the component 40b is described below with reference to FIG. 48. Identical parts are given the same reference signs as in the above-described embodiments, to the description of which reference is hereby made. In this embodiment, an intermediate layer 163 (interposer) is arranged between the mirror array 22 and the ASIC 52. In particular a silicon wafer with plated-through holes 164 (through silicon via wafer) serves as intermediate layer 163. In this exemplary embodiment, the rigid electrodes 158 are arranged on the intermediate layer 163. They are electrically conductively connected to the ASIC 52 via the plated-through holes 164. Flip-chip contact 165, in particular, can be provided for this purpose.

In each case adjacent to the rigid electrodes 158 shield electrodes 166 can be arranged on the intermediate layer 163. Such shielding electrodes 166 can also be provided in the exemplary embodiments described above.

A further embodiment of the component 40c is illustrated in FIG. 49. Identical parts are once again given the same reference signs as in the above-described embodiments, to the description of which is hereby made. In this exemplary embodiment, the rigid electrodes 158 are arranged on that side of the substrate 30 which faces the mirror element 23. They are therefore arranged directly below the mirror body 32 of the mirror element 23. In this exemplary embodiment, the mirror body 32 forms the moveable electrode of the speed sensor 151. In this exemplary embodiment, the rigid electrodes 158 are connected to the ASIC 52 via plated-through holes 167 through the substrate 30 via flip-chip contacts 168.

When using the projection exposure apparatus 1 with one of the collector variants described above, the reticle 24 and the wafer bearing a coating that is light-sensitive to the illumination light 10 are provided. Afterward, at least one section of the reticle 24 is projected onto the wafer with the aid of the projection exposure apparatus 1. During the projection of the reticle 24 onto the wafer, the reticle holder and/or the wafer holder can be displaced in a direction parallel to the object plane 6 and/or parallel to the image plane 9. The displacement of the reticle 24 and of the wafer can preferably be effected synchronously with one another. Finally, the light-sensitive layer exposed via the illumination light 10 on the wafer is developed. A micro- or nanostructured component, in particular semiconductor chip, is produced in this way.

The invention claimed is:
1. An optical component, comprising:
a mirror array comprising a multiplicity of mirror elements, each mirror element having at least one degree of freedom of displacement;
a multiplicity of actuators, each actuator configured to displace an associated mirror element;
a carrying structure mechanically connected to the mirror array; and
a multiplicity of local regulating devices, each local regulating device configured to dampen oscillations of an associated mirror element,
wherein:
a totality of the mirror elements defines a parquet of a total reflection surface of the mirror array;
the mirror array has a total surface extending perpendicular to a surface normal;
the carrying structure projects beyond the total surface of the mirror array in a direction perpendicular to the surface normal by at most 5 mm;
each local regulating device comprises a capacitive sensor;
each capacitive sensor comprises:
a moveable electrode in the form of an actuator pin; and
an electrode arranged rigidly relative to the carrying structure; and
for each capacitive sensor:
the moveable electrode is a constituent part of the actuator for the associated mirror element; and
the moveable electrode is electrically decoupled from its associated mirror element.

2. The component of claim 1, wherein each capacitive sensor comprises an electrode arranged rigidly relative to the carrying structure for each degree of freedom of displacement of the associated mirror element.

3. The component of claim 1, wherein, for each capacitive sensor, the rigidly arranged electrode is configured so that the capacitive sensor has a predefined characteristic.

4. The component of claim 1, wherein, for each capacitive sensor, the rigidly arranged electrode is integrated into an application-specific integrated circuit.

5. The component of claim 1, wherein each local regulating device comprises an electronic circuit.

6. The component of claim 1, wherein:
each capacitive sensor comprises an electrode arranged rigidly relative to the carrying structure for each degree of freedom of displacement of the associated mirror element; and
for each capacitive sensor, each rigidly arranged electrode is configured so that the capacitive sensor has a predefined characteristic.

7. The component of claim 1, wherein:
each capacitive sensor comprises an electrode arranged rigidly relative to the carrying structure for each degree of freedom of displacement of the associated mirror element; and
for each capacitive sensor, each rigidly arranged electrode is integrated into an application-specific integrated circuit.

8. The component of claim 1, wherein:
each capacitive sensor comprises an electrode arranged rigidly relative to the carrying structure for each degree of freedom of displacement of the associated mirror element; and
each local regulating device comprises an electronic circuit.

9. A system, comprising:
a component according to claim 1; and
a global control/regulating device configured to displace the mirror elements.

10. An optical assembly, comprising:
a baseplate;
a fixing device; and
an optical component according to claim 1,
wherein the fixing device fixes the optical component to the baseplate.

11. An optical unit, comprising
a system, comprising:
a component according to claim 1; and
a global control/regulating device configured to displace the mirror elements.

12. An illumination system, comprising:
an EUV radiation source; and
an optical unit which comprises a mirror system, the mirror system comprising:
   a component according to claim 1; and
   a global control/regulating device configured to displace the mirror elements.

13. An apparatus, comprising:
an EUV radiation source; and
an optical unit which comprises a mirror system, the mirror system comprising:
   a component according to claim 1; and
   a global control/regulating device configured to displace the mirror elements; and
a projection optical unit,
wherein the apparatus is an EUV microlithography projection exposure apparatus.

14. A method, comprising:
making a component according to claim 1, including using lithography to fashion the rigid electrodes.

15. A method, comprising:
using a global control/regulating device to predefine position data for positioning each mirror element of a component according to claim 1; and
using the local regulating devices to dampen disturbances of the positioning of the mirror elements.

16. A method, comprising:
using an optical unit to illuminate a reticle comprising structures with EUV radiation, the optical unit comprising a component according to claim 1; and
using a projection optical unit to project at least a part of the reticle onto a light-sensitive material.

17. The component of claim 1, wherein each actuator pin has a circular cross section.

18. The component of claim 1, wherein each rigidly arranged electrode has a form so that the sensor has a linearized characteristic or a characteristic which is proportional to the characteristic of the actuator.

19. The component of claim 1, wherein, for at least one capacitive sensor, the component comprises three or more electrodes are arranged in a plane around the actuator pin.

20. An optical component, comprising:
a mirror array comprising a multiplicity of mirror elements, each mirror element having at least one degree of freedom of displacement;
a multiplicity of actuators, each actuator configured to displace an associated mirror element;
a carrying structure mechanically connected to the mirror array; and
a multiplicity of local regulating devices, each local regulating device configured to dampen oscillations of an associated mirror element,
wherein:
   a totality of the mirror elements defines a parquet of a total reflection surface of the mirror array;
   the mirror array has a total surface extending perpendicular to a surface normal;
   the carrying structure projects beyond the total surface of the mirror array in a direction perpendicular to the surface normal by at most 5 mm;
   each local regulating device comprises a capacitive sensor;
   each capacitive sensor comprises:
      a moveable electrode in the form of an actuator pin; and
      an electrode arranged rigidly relative to the carrying structure; and
   for at least one capacitive sensor:
      the moveable electrode is a constituent part of the actuator for the associated mirror element; and
      the moveable electrode is electrically decoupled from its associated mirror element.

* * * * *

UNITED STATES PATENT AND TRADEMARK OFFICE
CERTIFICATE OF CORRECTION

PATENT NO. : 9,804,501 B2
APPLICATION NO. : 14/334107
DATED : October 31, 2017
INVENTOR(S) : Severin Waldis et al.

It is certified that error appears in the above-identified patent and that said Letters Patent is hereby corrected as shown below:

On the Title Page

Column 1 (Inventors), Line 6: Delete "Courtman" and insert -- Courtaman --, therefor.

In the Specification

Column 11, Line 44: Delete "tesselation," and insert -- tessellation, --, therefor.

Column 25, Line 2: Delete "a the" and insert -- the --, therefor.

Signed and Sealed this
Third Day of April, 2018

Andrei Iancu
*Director of the United States Patent and Trademark Office*